(12) United States Patent
Pampattiwar et al.

(10) Patent No.: US 12,728,680 B2
(45) **Date of Patent: *Sep. 8, 2026**

(54) ADAPTER FOR SELECTING LAMP FUNCTION IN A TRUCK TRAILER

(71) Applicant: Grote Industries, Inc., Madison, IN (US)

(72) Inventors: Sankalp Pampattiwar, Madison, IN (US); Yogesh Kubal, Madison, IN (US); Shengjie Tang, Madison, IN (US); Cesar Perez-Bolivar, Madison, IN (US)

(73) Assignee: Grote Industries, Inc., Madison, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/592,929

(22) Filed: Mar. 1, 2024

(65) Prior Publication Data

US 2024/0424846 A1 Dec. 26, 2024

Related U.S. Application Data

(63) Continuation of application No. 17/946,385, filed on Sep. 16, 2022, now Pat. No. 11,945,269, which is a (Continued)

(51) Int. Cl.
*B60D 1/64* (2006.01)
*B60Q 1/30* (2006.01)
(Continued)

(52) U.S. Cl.
CPC ............... *B60D 1/64* (2013.01); *B60Q 1/305* (2013.01); *B60Q 11/005* (2013.01); *G01R 31/44* (2013.01); *H01R 2201/20* (2013.01)

(58) Field of Classification Search
CPC ........ B60D 1/64; B60Q 1/305; B60Q 11/005; G01R 31/44; H01R 2201/20
(Continued)

(56) References Cited

U.S. PATENT DOCUMENTS 4,547,722 A * 10/1985 Sarlo ...................... G01R 31/44 324/504
4,939,503 A * 7/1990 Swanson .............. B60Q 11/007 340/468
(Continued)

FOREIGN PATENT DOCUMENTS

CN 107921884 A 4/2018
EP 1 508 482 A1 2/2005

OTHER PUBLICATIONS

English abstract for CN 107921884 A obtained from Google Patents on Jun. 6, 2024.

*Primary Examiner* — Zhen Y Wu
(74) *Attorney, Agent, or Firm* — Woodard Emhardt Henry Reeves & Wagner LLP

(57) ABSTRACT

An adapter for use with components of a truck trailer. The adapter may include multiple input terminals corresponding with multiple terminals of a trailer component socket of a trailer, and multiple output terminals configured to electrically connect with corresponding input terminals of a trailer component. The adapter may also include an adapter circuit configured to electrically connect at least four of the input terminals with at least four of the multiple output terminals. The multiple output terminals may include at least two mode selection output terminals configured to provide a mode selection to the trailer component, and the trailer component optionally includes control logic configured to activate and deactivate the trailer component according to the mode selection.

16 Claims, 10 Drawing Sheets

Related U.S. Application Data continuation of application No. 16/691,903, filed on Nov. 22, 2019, now Pat. No. 11,479,069.

(60) Provisional application No. 62/772,840, filed on Nov. 29, 2018.

(51) Int. Cl.
*B60Q 11/00* (2006.01)
*G01R 31/44* (2020.01)

(58) Field of Classification Search
USPC .......................................................... 340/431
See application file for complete search history.

(56) References Cited

U.S. PATENT DOCUMENTS

| | | | | |
|---|---|---|---|---|
| 5,521,466 | A * | 5/1996 | Vincent | B60R 16/0315 315/86 |
| 5,719,552 | A * | 2/1998 | Thompson | B60Q 1/305 200/61.04 |
| 5,729,058 | A * | 3/1998 | Groeller | B60D 1/64 315/77 |
| 5,775,712 | A | 7/1998 | Link et al. | |
| 6,007,346 | A * | 12/1999 | Gutierrez | H01R 29/00 439/35 |
| 6,087,777 | A * | 7/2000 | Long | B60D 1/62 340/468 |
| 6,172,508 | B1 * | 1/2001 | Nutt | G01R 31/006 324/504 |
| 6,263,269 | B1 | 7/2001 | Dannenberg | |
| 6,545,600 | B1 * | 4/2003 | Boner | B60Q 1/305 340/468 |
| 6,652,038 | B1 * | 11/2003 | Frye | B60T 7/20 303/7 |
| 6,985,343 | B2 | 1/2006 | Mirowski et al. | |
| 7,064,658 | B2 | 6/2006 | Burlak et al. | |
| 7,491,065 | B2 * | 2/2009 | Wagner | H01R 13/5213 439/35 |
| 7,601,007 | B1 | 10/2009 | Pogue | |
| 7,932,623 | B2 | 4/2011 | Burlak et al. | |
| 8,061,879 | B2 | 11/2011 | Simmons et al. | |
| 8,179,142 | B2 * | 5/2012 | Kulkarni | B60Q 1/305 324/504 |
| 9,102,267 | B2 | 8/2015 | Kulkarni | |
| 9,150,201 | B2 | 10/2015 | Smith et al. | |
| 9,315,173 | B1 * | 4/2016 | Gray | B60T 7/042 |
| 9,559,475 | B1 * | 1/2017 | Shaeffer | H01R 31/06 |
| 9,738,125 | B1 * | 8/2017 | Brickley | B60W 50/14 |
| 10,421,395 | B2 * | 9/2019 | Snell | B60Q 1/305 |
| 10,663,508 | B1 * | 5/2020 | Walker | G01R 31/44 |
| 11,390,256 | B2 * | 7/2022 | Lange, III | B60Q 1/0094 |
| 11,479,069 | B2 * | 10/2022 | Pampattiwar | B60Q 1/305 |
| 11,945,269 | B2 * | 4/2024 | Pampattiwar | B60D 1/64 |
| 2002/0098718 | A1 | 7/2002 | Harmon et al. | |
| 2003/0020331 | A1 * | 1/2003 | Burdick | B60D 1/62 307/9.1 |
| 2004/0160123 | A1 * | 8/2004 | Burdick | B60D 1/62 307/10.1 |
| 2005/0168327 | A1 * | 8/2005 | De Wilde | B60D 1/62 340/431 |
| 2006/0085099 | A1 * | 4/2006 | Burlak | H01R 31/065 701/1 |
| 2007/0193795 | A1 * | 8/2007 | Forsyth | B60L 50/50 180/65.285 |
| 2008/0231285 | A1 * | 9/2008 | Curtis | B60Q 1/305 324/504 |
| 2009/0302858 | A1 * | 12/2009 | Kulkarni | B60Q 1/305 324/504 |
| 2010/0152989 | A1 * | 6/2010 | Smith | B60T 8/1708 303/20 |
| 2011/0233895 | A1 * | 9/2011 | Risse | B60D 1/64 280/420 |
| 2011/0237090 | A1 * | 9/2011 | Ehrlich | B60Q 1/0088 439/36 |
| 2011/0272916 | A1 * | 11/2011 | Risse | B60D 1/62 280/420 |
| 2011/0287637 | A1 * | 11/2011 | Workman | B60D 1/64 439/35 |
| 2012/0041659 | A1 * | 2/2012 | Greene | B60D 1/30 701/70 |
| 2013/0264863 | A1 * | 10/2013 | McCollum | B60Q 1/46 307/9.1 |
| 2013/0335988 | A1 * | 12/2013 | Rotenberg | H01R 31/065 362/485 |
| 2014/0022389 | A1 * | 1/2014 | Kageta | H01R 43/26 348/148 |
| 2014/0172261 | A1 * | 6/2014 | Barlsen | B60Q 1/444 701/70 |
| 2015/0137961 | A1 * | 5/2015 | Bean | G01R 31/007 340/431 |
| 2015/0210254 | A1 * | 7/2015 | Pieronek | B60T 8/248 701/70 |
| 2015/0216013 | A1 * | 7/2015 | Tarr | H05B 47/10 315/77 |
| 2015/0236466 | A1 * | 8/2015 | Armacost | H01R 31/02 29/857 |
| 2015/0362544 | A1 * | 12/2015 | Bean | B60Q 1/305 324/503 |
| 2015/0367774 | A1 * | 12/2015 | Motts | B60Q 1/2607 315/77 |
| 2016/0121792 | A1 * | 5/2016 | Christopherson | G01R 31/44 340/431 |
| 2016/0214551 | A1 * | 7/2016 | Armacost | B60D 1/36 |
| 2017/0066363 | A1 * | 3/2017 | Orazem | F21S 41/657 |
| 2017/0217372 | A1 | 8/2017 | Lu et al. | |
| 2017/0240059 | A1 * | 8/2017 | Weicker | B60L 53/16 |
| 2017/0285084 | A1 * | 10/2017 | Johnson | G01R 31/007 |
| 2017/0341572 | A1 * | 11/2017 | Snell | G08G 1/165 |
| 2017/0349093 | A1 * | 12/2017 | Peacock | B60Q 1/0088 |
| 2018/0099712 | A1 * | 4/2018 | Bean | G05B 19/4185 |
| 2018/0304944 | A1 * | 10/2018 | Wright | B62D 59/04 |
| 2019/0016185 | A1 * | 1/2019 | Cosentino | B60D 1/64 |
| 2019/0111899 | A1 * | 4/2019 | Lange, III | B60T 8/17 |
| 2019/0118670 | A1 * | 4/2019 | Vallier | B62K 27/10 |
| 2019/0152282 | A1 * | 5/2019 | Spengler | B60D 1/62 |
| 2019/0217831 | A1 * | 7/2019 | Viele | B60D 1/245 |
| 2019/0299861 | A1 * | 10/2019 | Weigert | B60Q 1/2661 |
| 2020/0041556 | A1 * | 2/2020 | Hamila | G07C 5/0825 |
| 2020/0130745 | A1 * | 4/2020 | Cooke | B60D 1/64 |
| 2020/0189445 | A1 * | 6/2020 | Foster | H04L 12/40045 |

* cited by examiner 800
620
340
615
335
805
310
610
305
605
802

1000
620
340
1005
615
335
310
610
305
605
1002

700
620
340
615
335
705
310
610
305
605
702

600
340
620
615
335
310
610
605
305

900
620
340
615
335
310
610
305
605
902

ADAPTER FOR SELECTING LAMP FUNCTION IN A TRUCK TRAILER

CROSS-REFERENCE TO RELATED APPLICATIONS

This application is a continuation of U.S. patent application Ser. No. 17/946,385 filed Sep. 16, 2022, which is a continuation of U.S. patent application Ser. No. 16/691,903 filed Nov. 22, 2019, which claims the benefit of U.S. Provisional Patent Application No. 62/772,840 filed Nov. 29, 2018 which is hereby incorporated by reference.

BACKGROUND

Cable systems for truck trailers are limited because each functional aspect of the wiring system in the trailer requires its own separate power line directly connecting the lamp or other trailer component exercising that function to a corresponding circuit in the tractor. Thus each wire in a conventional cabling system is generally limited in what it may be used for because it is often electrically connected to deliver power only to specific components of the trailer such as to a specific brake lamp or turn signal lamp.

More recently, trailer wiring is increasingly required to support more complex functions and/or other electronic devices such as sensors for monitoring the state of the trailer and the load, cameras for providing additional visibility, additional exterior or interior lighting, or other electronic devices. However, with a limited number of electrical connections between the trailer and the tractor, and with each connection being dedicated to possibly only one function, conventional trailer cabling systems cannot easily accommodate the growing number of electronic devices used in trailers without upgrades to the wiring.

However, to the extent that trailers have begun to introduce new wiring systems, these upgrades may require different pigtail connectors at different locations on the trailer, and/or different non-standard circuitry inside each trailer component at each location on the trailer in order to properly activate the upgraded functionality. This may require manufacturing multiple similar lamps specific to each location and function, thus adding cost and complexity to support upgraded functions.

SUMMARY

Disclosed is an adapter for use with components of a trailer. In one aspect, the adapter includes multiple input terminals corresponding with multiple terminals of a trailer component socket of a trailer, and multiple output terminals configured to electrically connect with corresponding input terminals of a trailer component. The adapter may also include an adapter circuit configured to electrically connect at least four of the input terminals with at least four of the multiple output terminals. In another aspect, the multiple output terminals may include at least two mode selection output terminals configured to provide a mode selection to the trailer component; and the trailer component optionally includes control logic configured to activate and deactivate the trailer component according to the mode selection.

In another aspect the multiple input terminals may include a power input terminal configured to electrically connect to a power circuit of the trailer, a ground input terminal configured to electrically connect to a ground circuit of the trailer, and at least one control input configured to electrically connect to at least one control cable of the trailer.

In another aspect, the multiple output terminals optionally include a power output terminal configured to electrically connect a power terminal of a trailer component to the power input terminal, and the trailer component is mounted to the trailer, a ground connection terminal configured to electrically connect a ground terminal of the trailer component to the ground input terminal, and at least one control output configured to electrically connect to the at least one control input of the trailer component. In another aspect the at least two mode selection output terminals may be configured to electrically connect to corresponding mode selection input terminals of the trailer component.

In another aspect, the adapter circuit may be configured to electrically connect the power input terminal to the power output terminal, the ground input terminal to the ground output terminal, and the at least one control input to the at least one control output. The adapter circuit is optionally configured to provide a mode selection to the trailer component using the at least one mode selection output terminal.

In another aspect, the at least two mode selection output terminals electrically connected to at least two dual position switches, and the dual position switches are optionally configured to provide a mode selection by selectively connecting each of the at least two mode selection output terminals to either the power input terminal or the ground input terminal.

In another aspect, the adapter optionally includes a housing with at least two dual position switches extending outside the housing. In another aspect, the adapter circuit optionally includes mode selection circuits electrically connecting each of the at least one mode selection output terminals to either the power input terminal or the ground input terminal. In another aspect, the housing may include, or be formed from, a polymeric material.

In another aspect, the adapter optionally includes a wireless receiver configured to receive the mode selection from a remote computing device, and a memory configured to store the mode selection. The adapter may also include a programming input terminal optionally configured to accept the mode selection as input provided using a programming cable coupled to a remote computing device, and optionally a memory configured to store the mode selection.

In another aspect, the trailer component control logic optionally includes a slave control circuit electrically connected to the power output terminal, the ground connection terminal, and the at least one control output. The slave control circuit may also be configured to receive control commands sent by a master control circuit such that the slave control circuit is configured to activate the trailer component when the master control circuit sends a control command that matches the mode selection provided by the adapter circuit.

In another aspect, the trailer component is a lamp, and the mode selection is a brake mode. In another aspect, the trailer component is a rear-facing camera, and the mode selection is a reverse mode.

In another aspect, the power input terminal, the ground input terminal, and the control output may be electrically connected to a master control circuit mounted in a trailer nosebox of the trailer. The master control circuit is optionally configured to accept control input from a truck tractor, and the master control circuit is optionally configured to generate a component control command specific to the trailer component, and to optionally deliver the component control command to the trailer component using at least one communication cable connection that may be electrically connected to the at least one control output.

In another aspect, the at least one control cable of the trailer optionally includes a first and second control cable. The first and second control cables may be electrically connected to a master Control Area Network (CAN) controller. The trailer component may include a slave CAN controller electrically connected to the first and second control cables, and the master and slave CAN controllers may communicate using a CAN protocol.

In another aspect, the at least one control cable of the trailer includes a single control cable that is optionally electrically connected to a master Local Interconnect Network (LIN) controller. The trailer component may include a slave LIN controller electrically connected to the single control cable, and the master and slave LIN controllers optionally communicate using a LIN protocol.

In another aspect, the trailer component may be a vehicle stop-tail-turn lamp, a vehicle turn signal lamp, a vehicle brake lamp, a vehicle tail lamp, a vehicle running lamp, a vehicle anti-lock brake, a vehicle interior illumination lamps, a vehicle reverse lamp, an antilock brake system controller, a pressure sensor, a temperature sensor, a door sensor, a cargo sensor, a cargo a length sensor, a liquid level sensor, or a refrigeration sensor.

Further forms, objects, features, aspects, benefits, advantages, and examples of the disclosed concepts will become apparent from the detailed description and drawings provided herewith.

DETAILED DESCRIPTION

Figure 1:
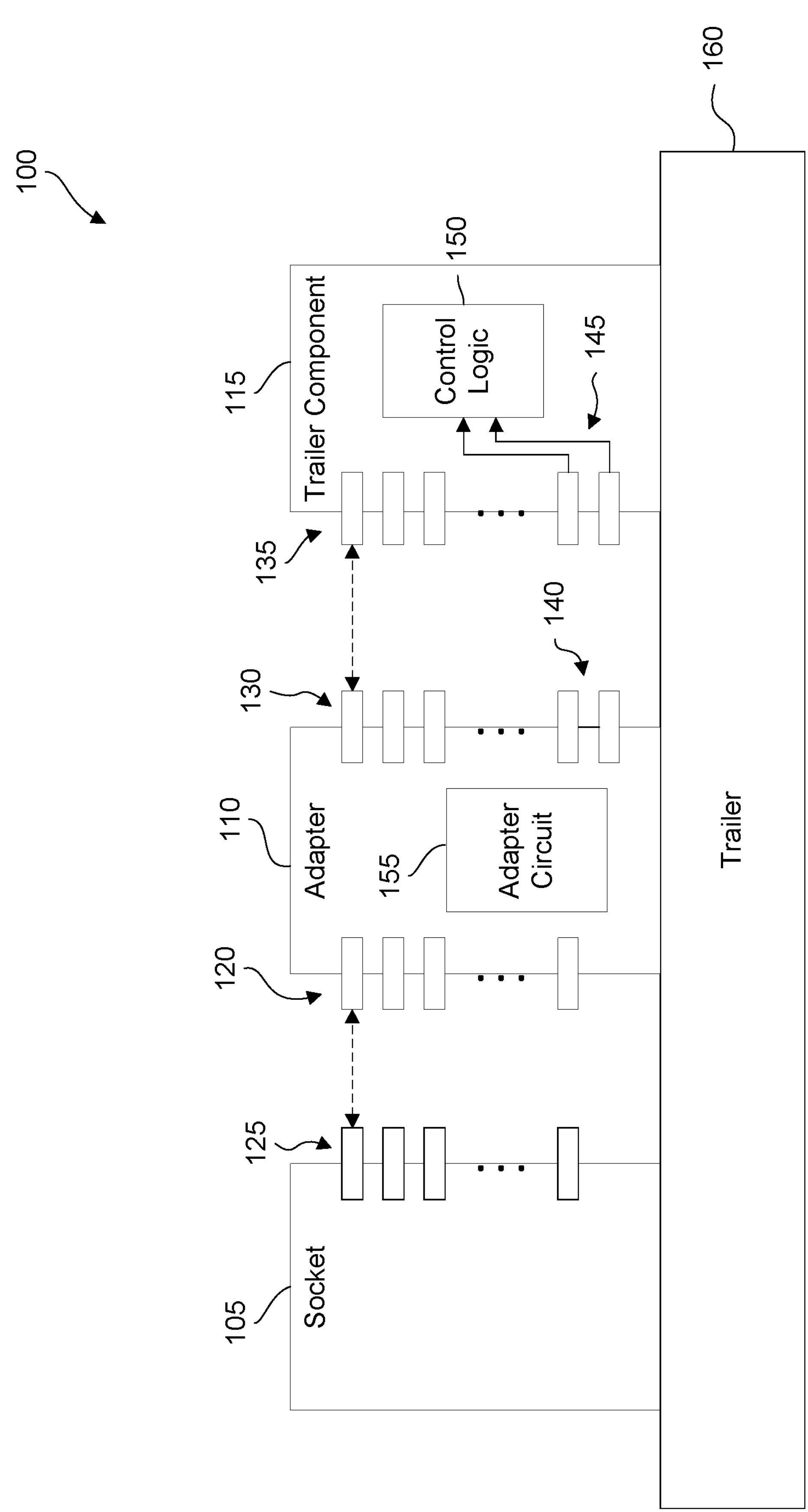
FIG. 1 is a component diagram illustrating one example of an adapter assembly.

FIG. 1 illustrates components that may be included in an adapter assembly 100 for mounting trailer components to a trailer 160. In the example of FIG. 1, an adapter assembly 100 includes a trailer component socket 105 coupled to an adapter 110, with the adapter 110 positioned between the trailer component socket 105 and a trailer component 115. In this example, the adapter 110 includes multiple adapter input terminals 120 corresponding with multiple trailer socket terminals 125 of a trailer component socket of a trailer 160. adapter 110 also includes multiple adapter output terminals 130 configured to electrically connect with corresponding trailer component input terminals 135 of trailer component 115.

Any suitable coupling mechanism by which trailer component socket 105 is coupled to trailer component 115 is envisioned whereby trailer socket terminals 125 electrically connect to trailer component input terminals 135. When adapter 110 is absent, trailer component 115 may be configured and arranged to be coupled to trailer component socket 105, preferably so that the trailer socket terminals 125 connect electrically to corresponding trailer component input terminals 135 of trailer component 115. For example, at least a portion of trailer component 115 may be arranged and configured to be insertable into trailer component socket 105. In another example, at least a portion of trailer component socket 105 may be insertable into trailer component 115. In another example, both a portion of trailer component socket 105 may be insertable into trailer component 115 while a portion of trailer component 115 may also be insertable trailer component socket 105. In another example, trailer component socket 105 and trailer component 115 may be configured to electrically connect such that no portion of trailer component socket 105 is insertable into trailer component 115, and/or no portion of trailer component 115 is insertable into trailer component socket 105. In this aspect, trailer component 115 may be coupled to trailer component socket 105 by other means such as by retaining clips, fasteners, adhesives, or by any other suitable means. In another example, trailer component socket 105, adapter 110, and/or trailer component 115 may be coupled to trailer 160.

With this in mind, adapter 110 may be positioned between trailer component socket 105 and trailer component 115 such that the adapter input terminals 120 of adapter 110 are preferably electrically connected to the trailer socket terminals 125, and the adapter output terminals 130 of adapter 110 are electrically connected to trailer component input terminals 135 of trailer component 115. Thus, in another aspect, electrical connections from trailer component socket 105 pass through adapter 110 to a trailer component 115 irrespective of any physical retention aspects of trailer component socket 105, adapter 110, or trailer component 115. Any suitable combination of mechanical connections between trailer component socket 105, adapter 110, and trailer component 115 that are arranged and configured maintain the electrical connections disclosed in further detail below are envisioned.

The adapter 110 optionally includes an adapter circuit 155 configured to electrically connect at least four of the adapter input terminals 120 with at least four of the adapter output terminals 130. In another aspect, the adapter output terminals 130 include at least two adapter mode selection terminals 140 configured to provide a mode selection to the trailer component by, for example, electrically connecting adapter mode selection terminals 140 to a corresponding group of component mode selection terminals 145. Trailer component 115 may also optionally include component control logic 150 configured to activate and deactivate the trailer component 115 according to the mode selection provided via adapter mode selection terminals 140 electrically connected to at least a portion of component mode selection terminals 145.

Figure 2:
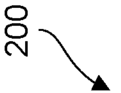
FIG. 2 is a component diagram illustrating additional aspects of an adapter assembly like the one shown in FIG. 1.
Figure 2:
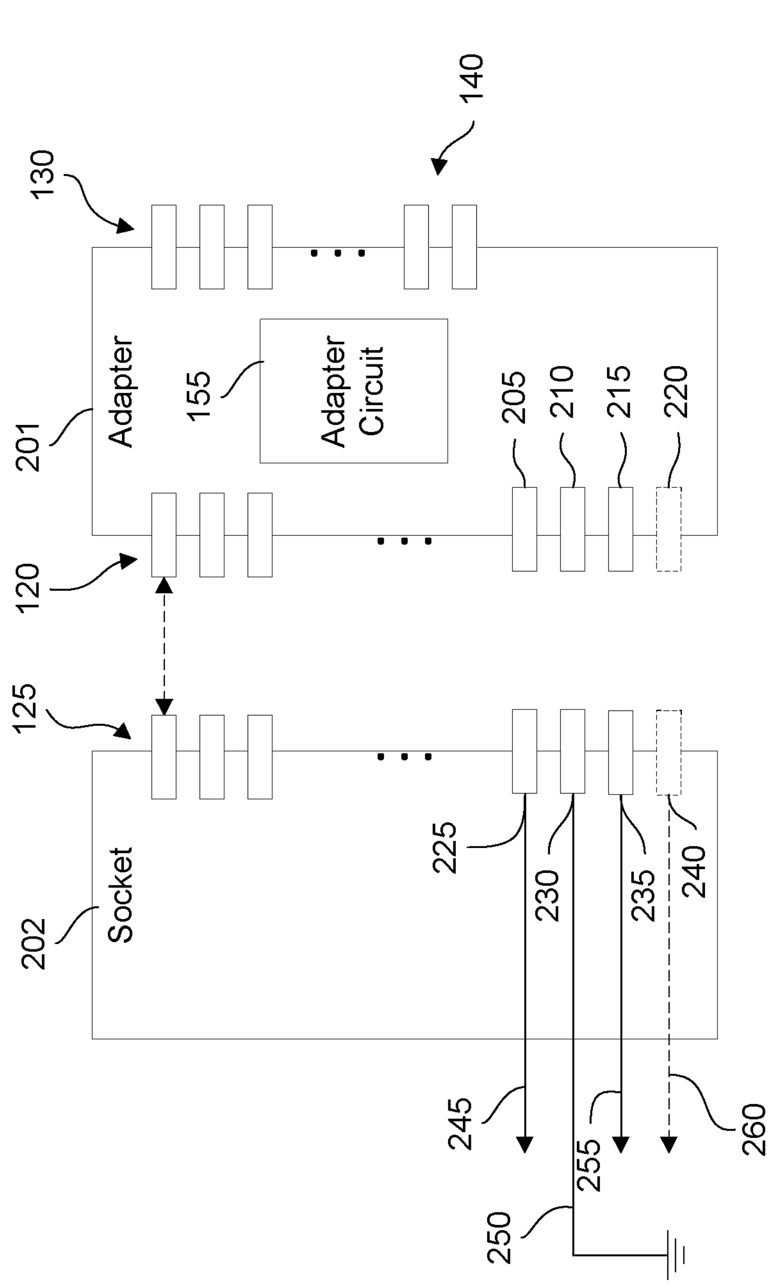

FIG. 2 illustrates aspects of an adapter assembly 200 that is like the one shown in FIG. 1. In FIG. 1, an adapter 201 includes adapter input terminals 120, two of which optionally are a power input terminal 205 configured to electrically connect to a trailer power circuit 245 and a ground terminal 210 configured to electrically connect to a trailer ground circuit 250. These connections may be provided via by a trailer component socket 202.

In another aspect, trailer component socket 202 includes trailer socket terminals 125, one of which is socket power output 225 and another of which is socket ground 230. socket power output 225 may be electrically connected to trailer power circuit 245, and socket ground 230 may be electrically connected to trailer ground circuit 250. A socket control output 235 of trailer component socket 202 may be electrically connected through trailer component socket 202 to a trailer control cable 255, and an optional second socket control output 240 of trailer component socket 202 may be electrically connected through trailer component socket 202 to an optional second trailer control cable 260. Thus trailer component socket 202 is adapted to provide electrical connections between power input terminal 205 and trailer power circuit 245 via corresponding terminal connections between power input terminal 205 and socket power output 225.

Similarly, trailer component socket 202 is adapted to provide electrical connection between ground terminal 210 and trailer ground circuit 250 via corresponding terminal connections between socket ground 230 and ground terminal 210. The trailer component socket 202 may also be adapted to provide electrical connection between control input 215 and trailer control cable 255 via corresponding terminal connections between socket control output 235 and ground terminal control input 215. In another aspect, trailer component socket 202 may also be adapted to provide electrical connection between optional second control input 220 and optional second trailer control cable 260 via corresponding terminal connections between optional second socket control output 240 and optional second control input 220.

Figure 3:
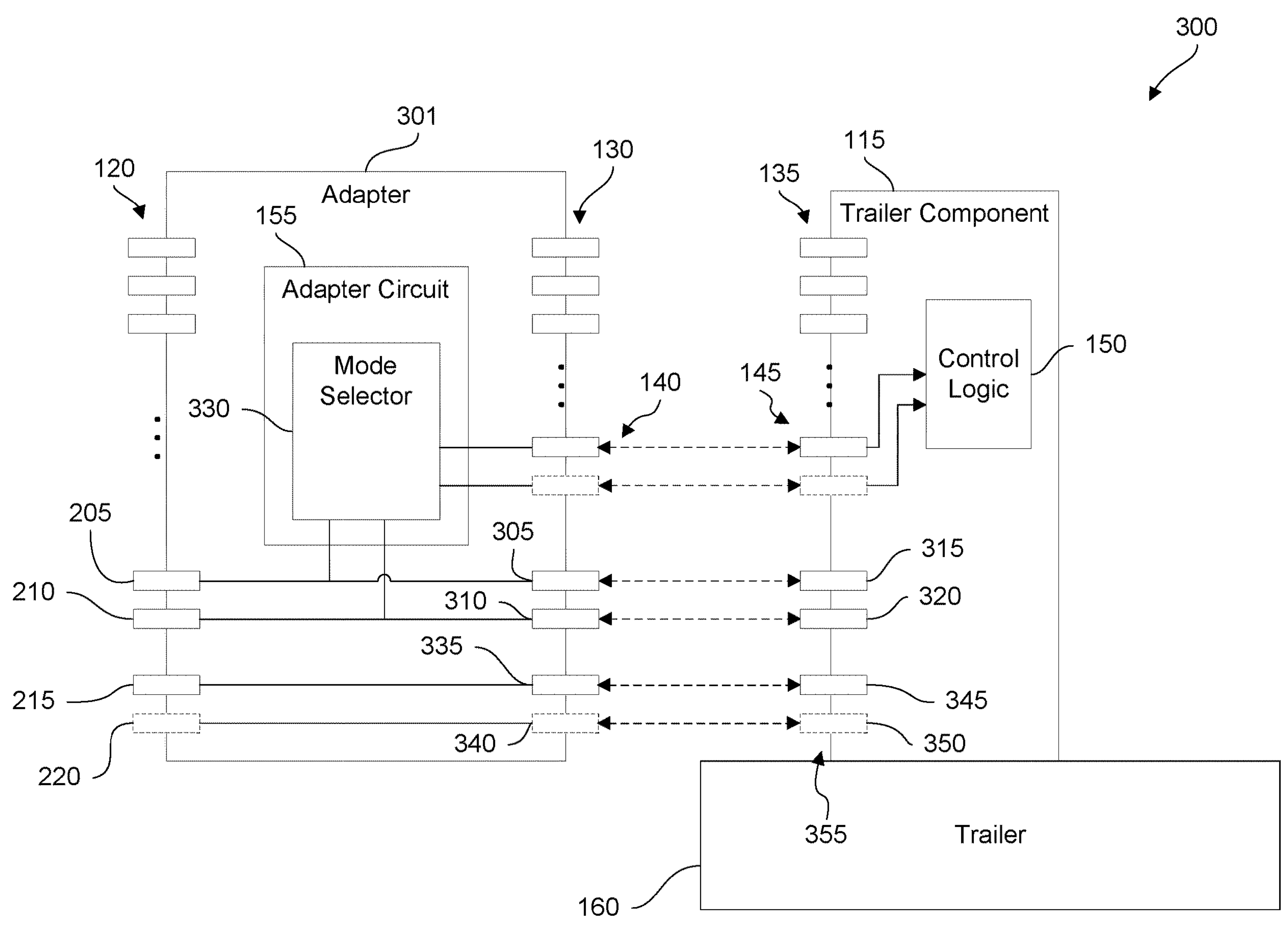
FIG. 3 is a component diagram illustrating another example of an adapter assembly like the one shown in FIG. 1.

FIG. 3 is a component diagram illustrating another example of an adapter assembly 300 like the one shown in the preceding figures. In this example, an adapter 301 is shown with adapter output terminals 130 that include a power output terminal 305 configured to electrically connect a component power terminal 315 of trailer component 115 to power input terminal 205. Also, adapter 301 optionally includes a ground output terminal 310 configured to electrically connect component ground terminal 320 to ground terminal 210. At least one adapter control output 335 may be included with adapter output terminals 130, adapter control output 335 configured to electrically connect to component control input 345 of trailer component 115.

In another aspect, adapter 301 may include circuits configured to electrically connect power input terminal 205 to power output terminal 305, ground terminal 210 to ground output terminal 310, and control input 215 to adapter control output 335. An additional control line or lines may be included in the cabling of trailer 160, and thus adapter 301 may also include circuits configured to electrically connect optional second control input 220 to optional second control output 340. In another aspect, adapter 301 may optionally include an adapter circuit 155 that may also include a mode selector 330 configured to provide a mode selection to trailer component 115 using adapter mode selection terminals 140.

The mode selection may be transmitted from mode selector 330 to component control logic 150 by adapter mode selection terminals 140 electrically connected to component mode selection terminals 145. The mode selection may be transmitted as a mode identifier, such as by a digital or analog signal presented on adapter mode selection terminals 140 and accepted by component mode selection terminals 145. For example, the mode identifier may be encoded as a pattern of bits where each of adapter mode selection terminals 140 and component mode selection terminals 145 represent a bit in the pattern such that the pattern represents a number. In this way, adapter mode selection terminals 140 and component mode selection terminals 145 may be thought of as being connected to a data bus configured to transfer the mode identifier provided by mode selector 330 to component control logic 150.

In another aspect, adapter circuit 155 may include a mode selector 330 operating as a mode selection circuit configured to electrically connect each of the adapter mode selection terminals 140 to either power input terminal 205 or ground terminal 210. In this way, adapter mode selection terminals 140 may provide a mode selection input where each of the adapter mode selection terminals 140 represents a single bit in a binary number pattern representing a mode identifier. This mode identifier may then be accepted as input to trailer component trailer component 115 specifying one or more operating modes under which trailer component trailer component 115 is to activate, deactivate, or to otherwise respond.

Figure 4:
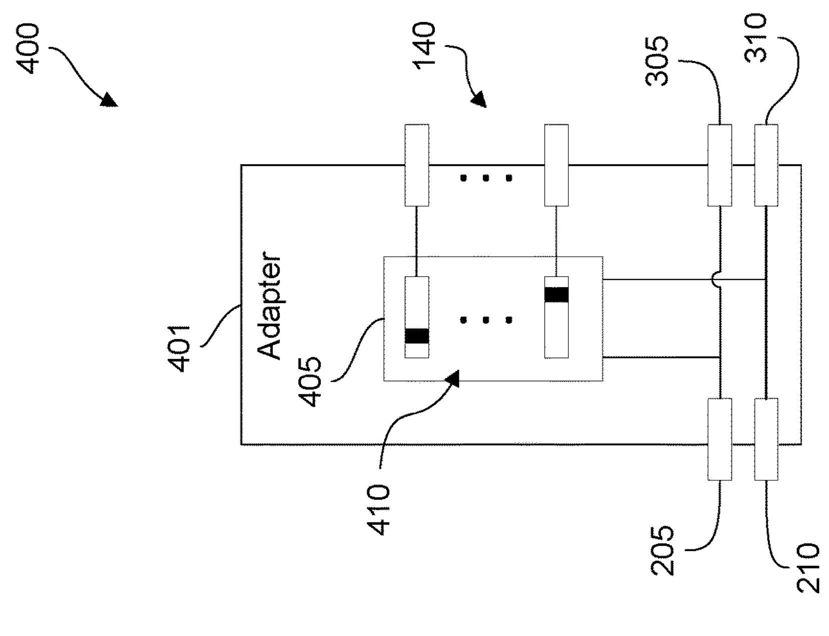
FIG. 4 is a component diagram illustrating another example of an adapter assembly like those in the preceding figures that has a manual mode selector.

FIG. 4 illustrates another example of an adapter assembly like those shown in the preceding figures. An adapter 401 includes a mode selector 405, electrically connected to at least two adapter mode selection terminals 140. In this example, mode selector 405 includes at least two dual position switches 410 configured to provide a mode selection by selectively connecting each of the at least two adapter mode selection terminals 140 to either power input terminal 205 or ground terminal 210. In this way, each of the dual position switches operate to provide a mode selection input for each of the adapter mode selection terminals 140 to define a binary number pattern representing a mode identifier. This mode identifier may then be accepted as input to trailer component 115 specifying one or more operating modes under which trailer component 115 is to activate, deactivate, or to otherwise respond. Any suitable number of switches may be included, such as two or more, four or more, 16 or more, and the like.

For example, adapter mode selection terminals 140 may include four separate inputs corresponding with four separate dual position switches dual position switches 410, dual position switches 410 may be set with the first and last switch on, with the remaining switches off. This arrangement presents the binary pattern 1001 which may be understood to mean “left turn operating mode”, trailer component 115 may therefore activate when trailer component 115 receives other input specifying that the system is now in “left turn mode”, such as when the driver actuates a turn signal control while operating the vehicle that is towing trailer 160.

Figure 5:
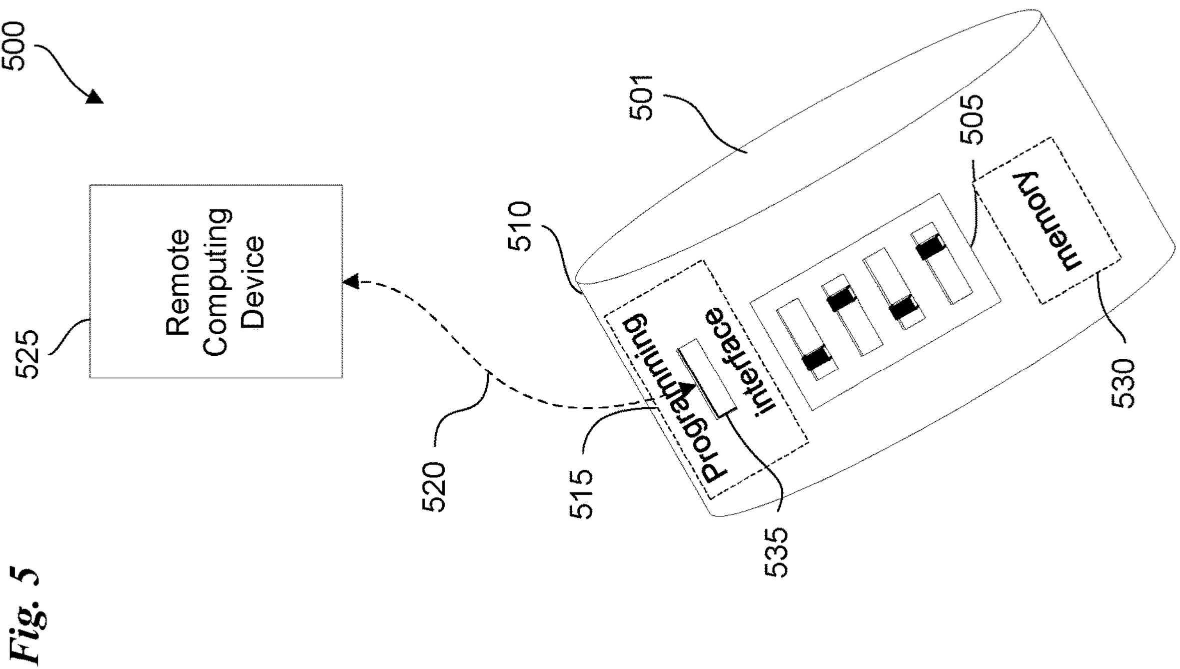
FIG. 5 is a component diagram illustrating another example of an adapter assembly like those shown in the preceding figures that has an external manual mode selector and programming interface.

FIG. 5 illustrates another example of an adapter assembly like those shown in the preceding figures that has an external manual mode selector and programming interface. In this example, an adapter assembly 500 includes an adapter 501 that has a housing 510. The housing 510 may optionally include, or be formed from, a polymeric material and/or a metallic material. In this example, a mode selector 505 includes a set of switches that extends through housing 510 to be accessible to a person adjusting the mode selector. In another aspect, the switches of mode selector 505 may be dual position switches such as in the case of set of Dual Inline Package (DIP) switches.

As with previous mode selectors implemented using switches, any suitable number of switches may be included, such as two or more, four or more, 16 or more, and the like. In other examples, the mode selector need not extend through the housing, such as in the case of a set of switches contained inside housing mode selector 505, or in another example, in the case of a mode selector stored as a binary pattern defining a number. In another aspect, the mode selector may be stored in a memory 530 within adapter 501. As illustrated at 500, the mode selector 505 may extend through the housing to allow access to the mode selector without disassembling adapter 501.

In another aspect, adapter 501 may optionally include a programming interface 515. Programming interface 515 may include a programming input terminal 535 that optionally passes through housing 510. Examples of such an input terminal include, but are not limited to, any suitable type of Universal Serial Bus (USB) terminal, and the like. In another aspect, programming interface 515 may be configured to accept the mode selection as input provided to adapter 501 using a communication link 520 coupled to a remote computing device 525. Communication link 520 may be implemented as a wired connection to programming interface 515, such as in the case of a USB cable.

In another example, communication link 520 may be implemented as a Bluetooth, Wi-Fi, or other suitable wireless link. In this example, adapter 501 may include one or more antennas, transceivers, processors, and other control logic for maintaining communication link 520 with remote computing device 525, and/or for obtaining one or more mode selections for adapter 501 provided by remote computing device 525. In any case, communication link 520 facilitates the transfer of a mode selection from remote computing device 525 to adapter 501. Adapter 501 may optionally include a memory 530 configured to store the mode selection provided either via programming interface 515 or mode selector 505, or both.

FIGS. 6-10 illustrate different examples of an adapter circuit for use in an adapter assembly like those shown in the preceding figures. In these examples, the adapter circuits are configured with a mode selector implemented by electrically connecting each of the one or more mode selection output terminals to either the power input terminal or the ground input terminal. In this way, each of adapter mode selection terminals 140 operate to provide a mode selection input defining a pattern representing a mode identifier.

This mode identifier may then be accepted as input to trailer component 115 specifying one or more operating modes under which trailer component 115 is to activate, deactivate, or to otherwise respond. Although four adapter mode selection terminals 140 are shown in FIGS. 6-10 examples, any suitable number of terminals may be included, such as two or more, four or more, 16 or more, and the like.

In FIGS. 6-10, the adapter circuit includes power output terminal 305, ground output terminal 310, adapter control output 335, and optional second control output 340. Adapter mode selection terminals 140 include adapter mode selection terminals 605, 610, 615, and 620, which may be configured to electrically connect to either power output terminal 305 or ground output terminal 310. For example, adapter mode selection terminal 605 may be electrically connected to power output terminal 305 by a circuit, such as a wire or a trace on Printed Circuit Board (PCB).

Figures 6, 7, 8, 9, 10:
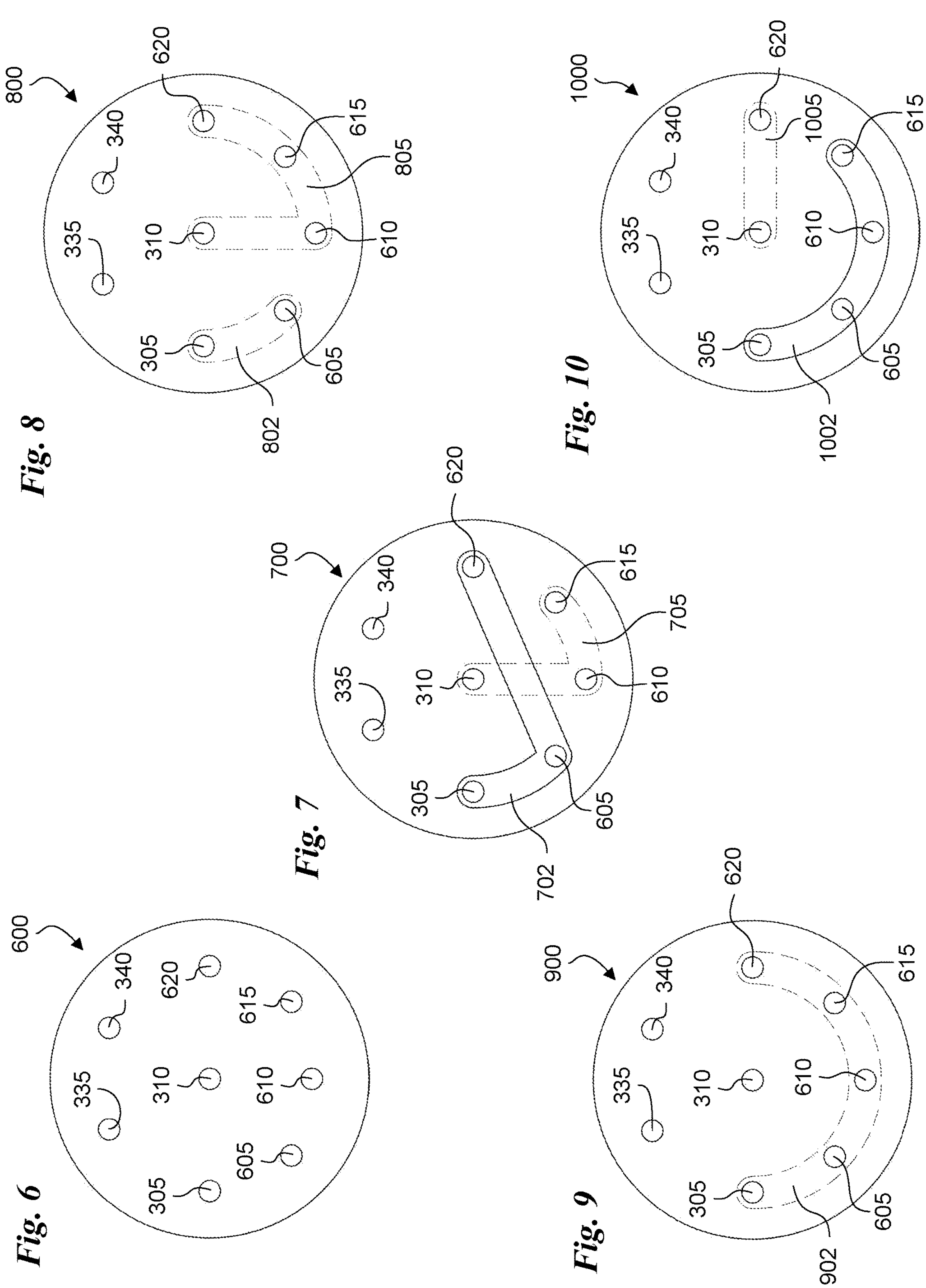
FIG. 6 is a component diagram illustrating one example of an adapter circuit for use in an adapter assembly like those shown in the preceding figures.
FIG. 7 is a component diagram illustrating another example of an adapter circuit for use in an adapter assembly like those shown in the preceding figures.
FIG. 8 is a component diagram illustrating another example of an adapter circuit for use in an adapter assembly like those shown in the preceding figures.
FIG. 9 is a component diagram illustrating another example of an adapter circuit for use in an adapter assembly like those shown in the preceding figures.
FIG. 10 is a component diagram illustrating another example of an adapter circuit for use in an adapter assembly like those shown in the preceding figures.

In FIG. 6, an adapter circuit 600 is shown that does not implement any mode selection. Such an “empty” or “null” mode selection is implemented by not connecting any of the adapter mode selection terminals 140 to either ground or power, and may be used as a “maintenance mode”, or for any other purpose.

In FIG. 7, an adapter circuit 700 is shown that implements a specific mode selection, such as, for example, in the case where adapter circuit 700 is used with a trailer component that includes a lamp, and the mode selection is a “braking” mode. Power trace 702 electrically connects power output terminal 305 with adapter mode selection terminal 605 and 620, and ground trace 705 electrically connects ground output terminal 310 to adapter mode selection terminal 610 and 615. In this way, adapter circuit 700 provides the mode identifier “1001” to the trailer component, and this identifier may mean, for example, that the component should operate in “braking” mode, or in some other mode such as in the “reverse” mode, or “turn signal” mode, or in some other mode with the identifier “1001”. In another aspect, adapter circuit 700 may include a PCB arranged and configured with power trace 702 on one side, and ground trace 705 is on a second side thus allowing them to intersect without causing an electrical short circuit.

In FIG. 8, an adapter circuit 800 is shown that illustrates another example of a circuit that implements a specific mode selection, such as, for example, in the case where adapter circuit 800 is used with a trailer component that includes a rear-facing camera, and the mode selection is a “reverse” mode. Power trace 802 electrically connects power output terminal 305 with adapter mode selection terminal 605, and ground trace 805 electrically connects ground output terminal 310 to adapter mode selection terminal 610, 615, and 620. Thus, adapter circuit 800 provides the mode identifier “1000” to the trailer component, and this identifier may mean, for example, that the component used with adapter circuit 800 should operate in “reverse” mode, or in some other mode with the identifier “1000”. In another aspect, adapter circuit 800 may include a PCB arranged and configured with both power trace 802 and ground trace 805 on one side of the board.

In FIG. 9, an adapter circuit 900 is shown that illustrates another example of a circuit that implements a specific mode selection, such as, for example, in the case where adapter circuit 900 is used with a trailer component that includes a temperature sensor, and the mode selection is an “always on” mode. Power trace 902 electrically connects power output terminal 305 with adapter mode selection terminal 605, 610, 615, and 620. Thus, adapter circuit 900 provides the mode identifier “1111” to the trailer component, and this identifier may mean, for example, that the component should remain active at all times.

In FIG. 10, an adapter circuit 1000 is shown that illustrates another example of a circuit that implements a specific mode selection, such as, for example, in the case where adapter circuit 1000 is used with a trailer component that includes a proximity sensor, and the mode selection is an "always on while moving" mode. Power trace 1002 electrically connects power output terminal 305 with adapter mode selection terminals 605, 610, and 615, and ground trace 1005 electrically connects adapter mode selection terminal 620 to ground output terminal 310. Thus, adapter circuit 1000 provides the mode identifier "1110" to the trailer component, and this identifier may mean, for example, that the component should remain active at all times while the truck is in gear, or perhaps while the trailer is moving, or both.

Figure 11:
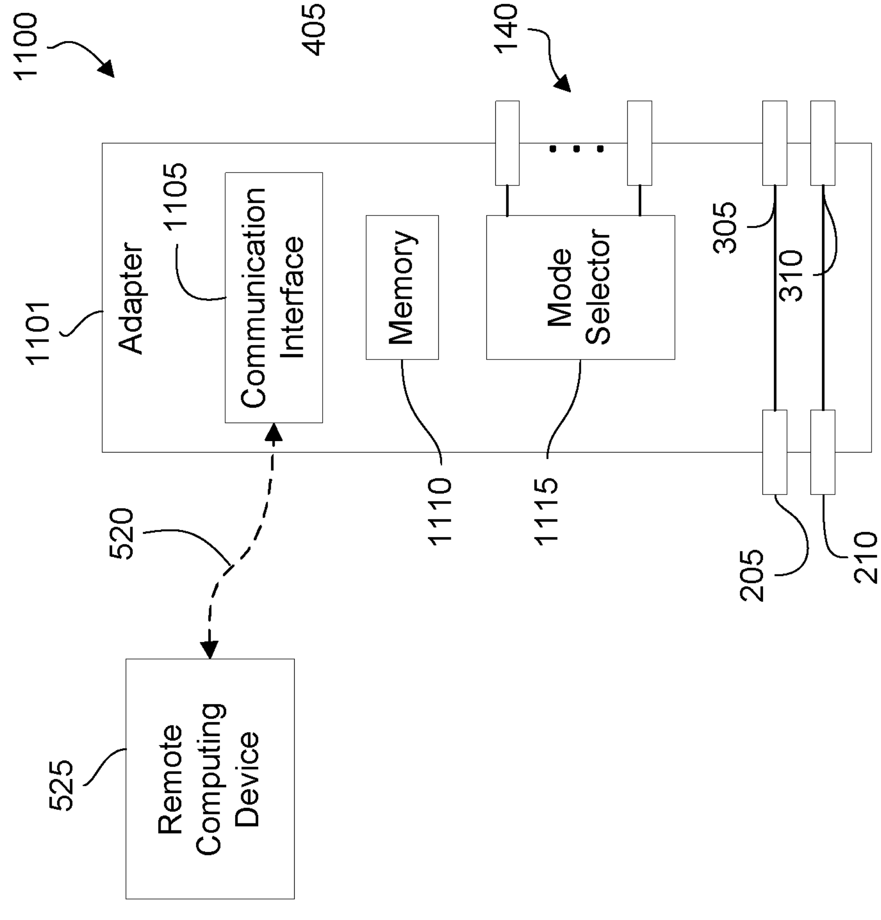
FIG. 11 is a component diagram illustrating another example of an adapter assembly like those shown in the preceding figures.

FIG. 11 illustrates another example of an adapter assembly like those shown in the preceding figures that has a remotely programmable electronic mode selector. In this example, an adapter assembly 1100 includes an adapter 1101 that has a communication interface 1105 for communicating with remote computing device 525 via communication link 520 to receive the mode identifier, and a memory 1110 for storing the mode identifier. A mode selector 1115 operates to present the mode identifier to a trailer component 115 coupled to adapter 1101 using adapter mode selection terminals 140.

As with previous mode selectors implemented using switches, circuits, and the like, any suitable number of adapter mode selection terminals 140 may be presented by mode selector 1115. In this example, adapter mode selection terminals 140 may be thought of as a mode selection bus with multiple adapter mode selection terminals 140 such as two or more, four or more, 16 or more, and the like.

In another aspect, communication link 520 may be implemented using any suitable wired or wireless technology such as via a USB cable, or via a Bluetooth, Wi-Fi, or other suitable wireless link. In this example, communication interface 1105 may include one or more antennas, receivers, transmitters, processors, and other control logic for maintaining communication link 520 with remote computing device 525, and/or for obtaining one or more mode identifiers provided by remote computing device 525.

Figure 12:
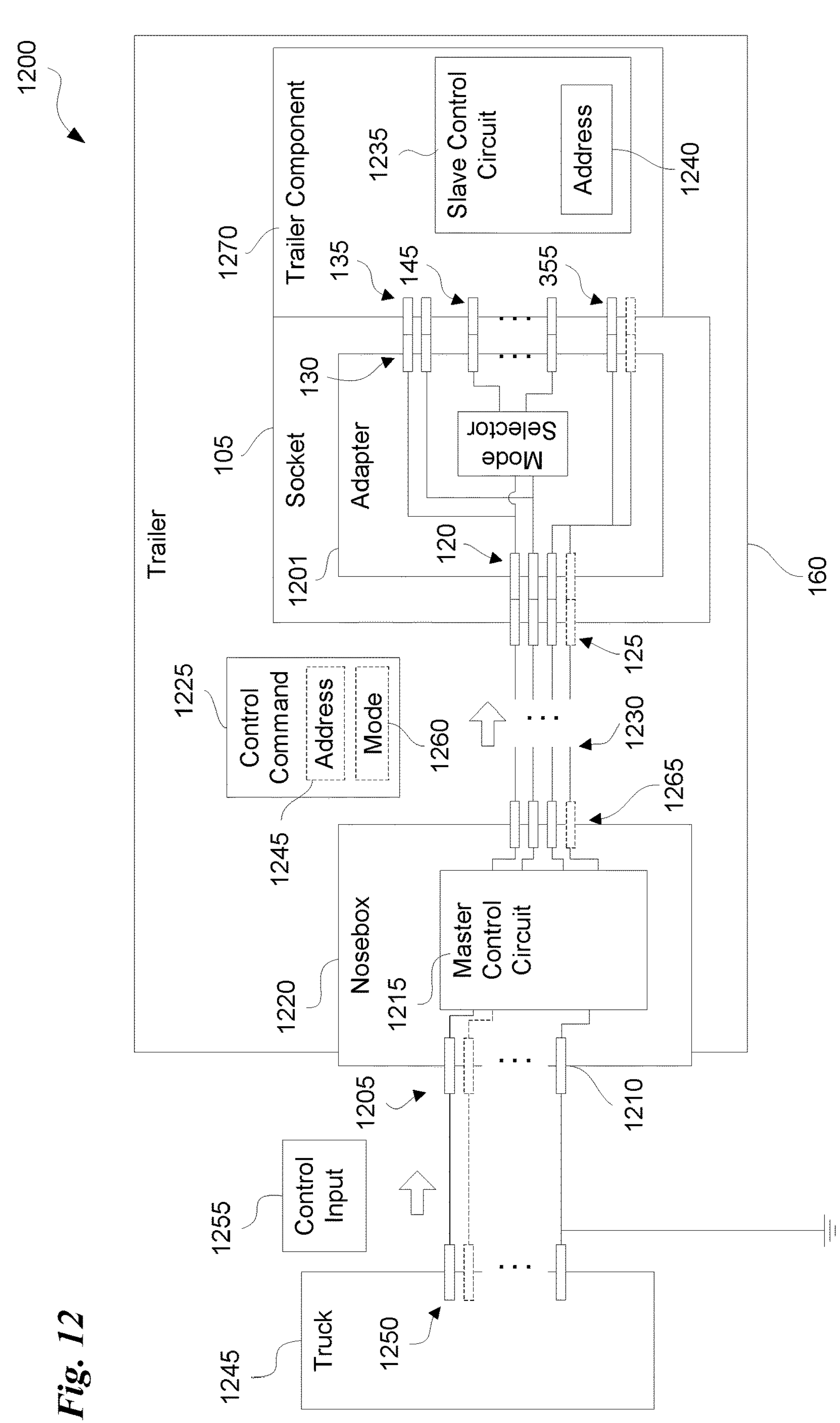
FIG. 12 is a component diagram illustrating another example of an adapter assembly like those shown in the preceding figures.

FIG. 12 is a component diagram illustrating is another example of an adapter assembly like those shown in the preceding figures. In FIG. 12, an adapter 1201 is used in conjunction with a trailer component 1270 that is coupled to a trailer wiring system that includes adapter 1201 coupled to trailer component socket 105. In this example, trailer component 1270 includes a slave control circuit 1235 configured to respond to multiple control commands 1225 sent by a master control circuit 1215 mounted in a nose box 1220 of trailer 160.

The slave control circuit 1235 is electrically connected to the adapter output terminals 130 via trailer component input terminals 135. The adapter output terminals 130 include power output terminal 305 and ground output terminal 310 electrically connected to trailer component input terminals 135. Slave control circuit 1235 is also electrically connected to control terminals 355 which include at least one adapter control output 335, and an optional second control output 340. The control terminals 355 are electrically connected to trailer socket terminals 125 through trailer wiring 1230 to a master control circuit 1215. The master control circuit 1215 is configured to generate and send multiple control commands 1225 which optionally include an address 1245 and/or a mode 1260. Thus slave control circuit 1235 is arranged and configured to receive control commands 1225 sent by master control circuit 1215, and to respond based at least on the mode identifier presented by adapter mode selection terminals 140.

In another aspect slave control circuit 1235 is optionally configured to activate aspects of trailer component 1270 when master control circuit 1215 sends a control command 1225 with an address 1245 that matches an address 1240 stored in slave control circuit 1235. In another aspect, slave control circuit 1235 is optionally configured to activate aspects of trailer component 1270 when 1215 sends a control command 1225 having a mode 1260 that matches the mode identifier presented by component mode selection terminals 145, and an address 1245 that matches address 1240 stored in slave control circuit 1235.

In another aspect, adapter input terminals 120 of adapter 1201 include a power input terminal like power input terminal 205, a ground input terminal like ground terminal 210, and at least one control cable like control input 215 and optional second control input 220. Output on corresponding output terminals 1265 may be provided by master control circuit 1215 based on input from truck terminals 1250. In this example, truck terminals 1250 may be electrically connected to nosebox terminals 1205 of nose box 1220, such as by one or more cables, or optionally, without using cables. nosebox terminals 1205 may be electrically connected to master control circuit 1215 mounted in a nose box 1220 of trailer 160. Electrical connections to output terminals output terminals 1265 of nose box 1220 may be maintained by trailer wiring 1230 which are electrically connected to adapter input terminals 120 of adapter 1201. Thus master control circuit 1215 is optionally configured to accept control input 1255 from a truck 1275, and to optionally generate a control command 1225 specific to trailer component 1270 using at least one communication cable connection like control input 215 and/or optional second control input 220 that are electrically connected to a control output of adapter 1201 like adapter control output 335 and optional second control output 340.

Figure 13:
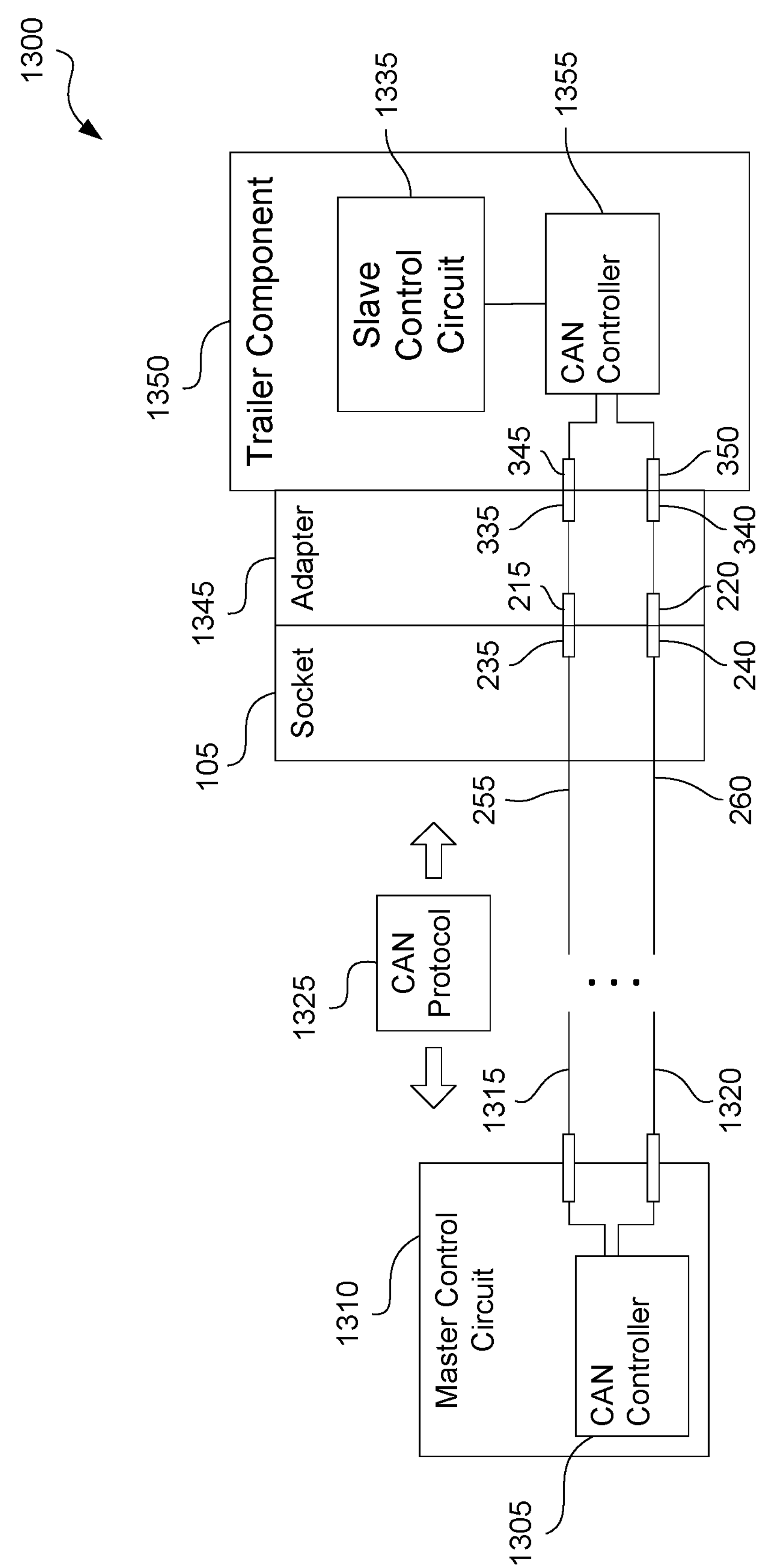
FIG. 13 is a component diagram illustrating another example of an adapter assembly like those shown in the preceding figures that uses a Control Area Network (CAN).

FIG. 13 is a component diagram illustrating another example of an adapter assembly 1300 that uses an adapter 1345 and a trailer component 1350 that is like those shown in the preceding figures that communicate between a master control circuit 1310 and a slave control circuit 1335 using a Control Area Network (CAN).

In this example, the trailer wiring like trailer wiring 1230 includes a first CAN high communication cable 1315 and a second CAN low communication cable 1320 which are electrically connected to a master CAN controller 1305. The CAN master controller 1305 may be included as a part of a master control circuit 1310, which may be optionally mounted in a nosebox of the trailer like nose box 1220. The trailer component 1350 optionally includes a slave CAN controller 1355 electrically connected to CAN high communication cable 1315 by component control input 345, adapter control output 335, control input 215, socket control output 235, and trailer control cable 255, all of which are electrically connected together. Electrical connections from slave CAN controller 1355 to CAN low communication cable 1320 are made via optional additional control input 350, optional second socket control output 240, optional second control input 220, optional second socket control output 240, and optional second trailer control cable 260, all of which are electrically connected together. In this way, master control circuit 1310 may communicate with slave CAN controller 1355 passing instructions, code, data, commands, and the like between master control circuit 1310 and slave control circuit 1335 using the CAN protocol 1325.

Figure 14:
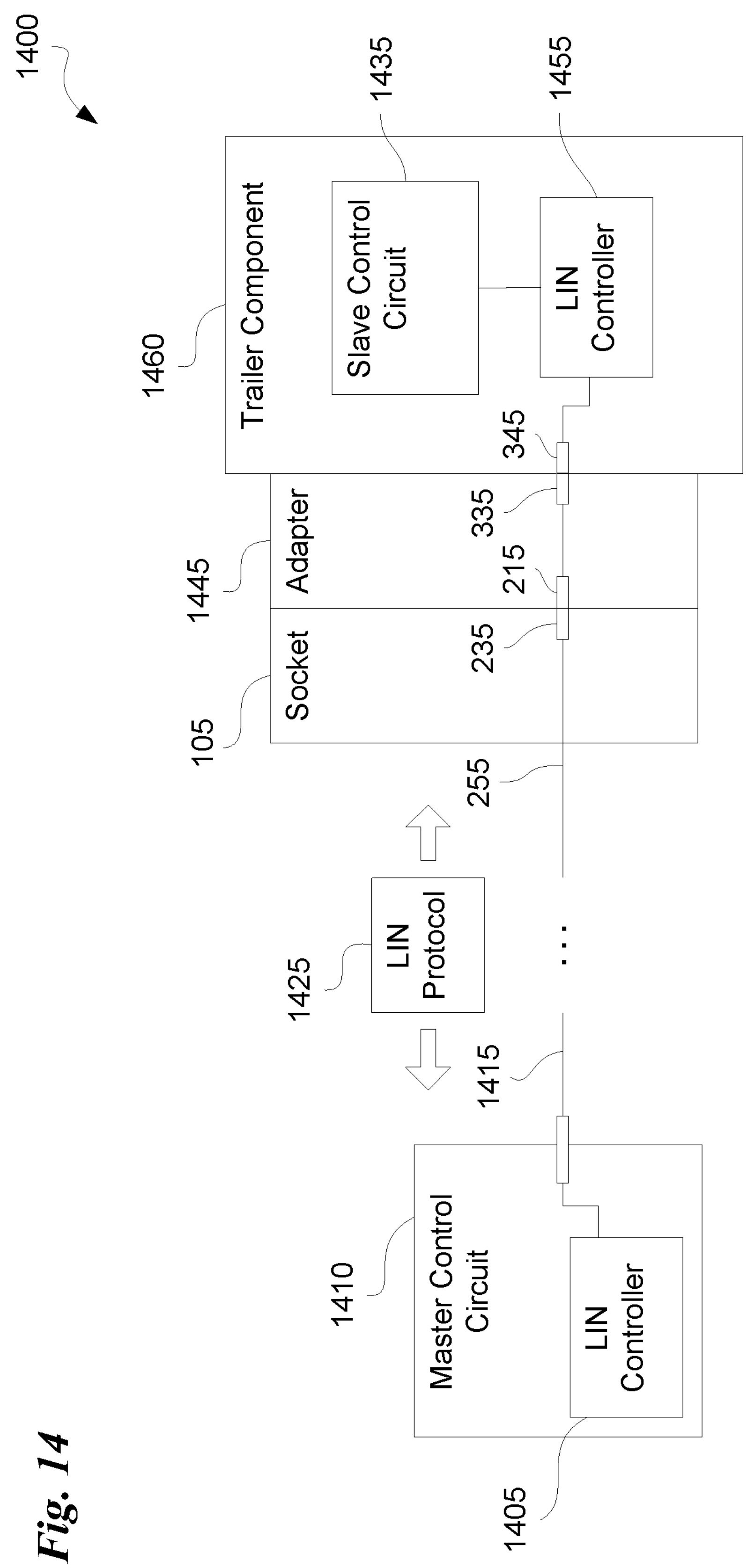
FIG. 14 is a component diagram illustrating another example of an adapter assembly like those shown in the preceding figures that uses a Local Interconnect Network (LIN).

FIG. 14 is a component diagram illustrating another example of an adapter assembly 1400 that uses an adapter 1445 and a trailer component 1460 that is like those shown in the preceding figures that communicate with a master control circuit 1410 using a Local Interconnect Network (LIN).

In this example, the trailer wiring like trailer wiring 1230 includes a LIN communication cable 1415 which is electrically connected to a LIN master controller 1405. The LIN master controller 1405 may be included as a part of a master control circuit 1410, which may be optionally mounted in a nosebox of the trailer like nose box 1220. The trailer component 1460 optionally includes a LIN slave controller 1455 electrically connected to LIN communication cable 1415 by component control input 345, adapter control output 335, control input 215, socket control output 235, and trailer control cable 255, all of which are electrically connected together. In this way, master control circuit 1410 may communicate with LIN slave controller 1455 passing instructions, code, data, commands, and the like, using the LIN Protocol 1425.

Figure 15:
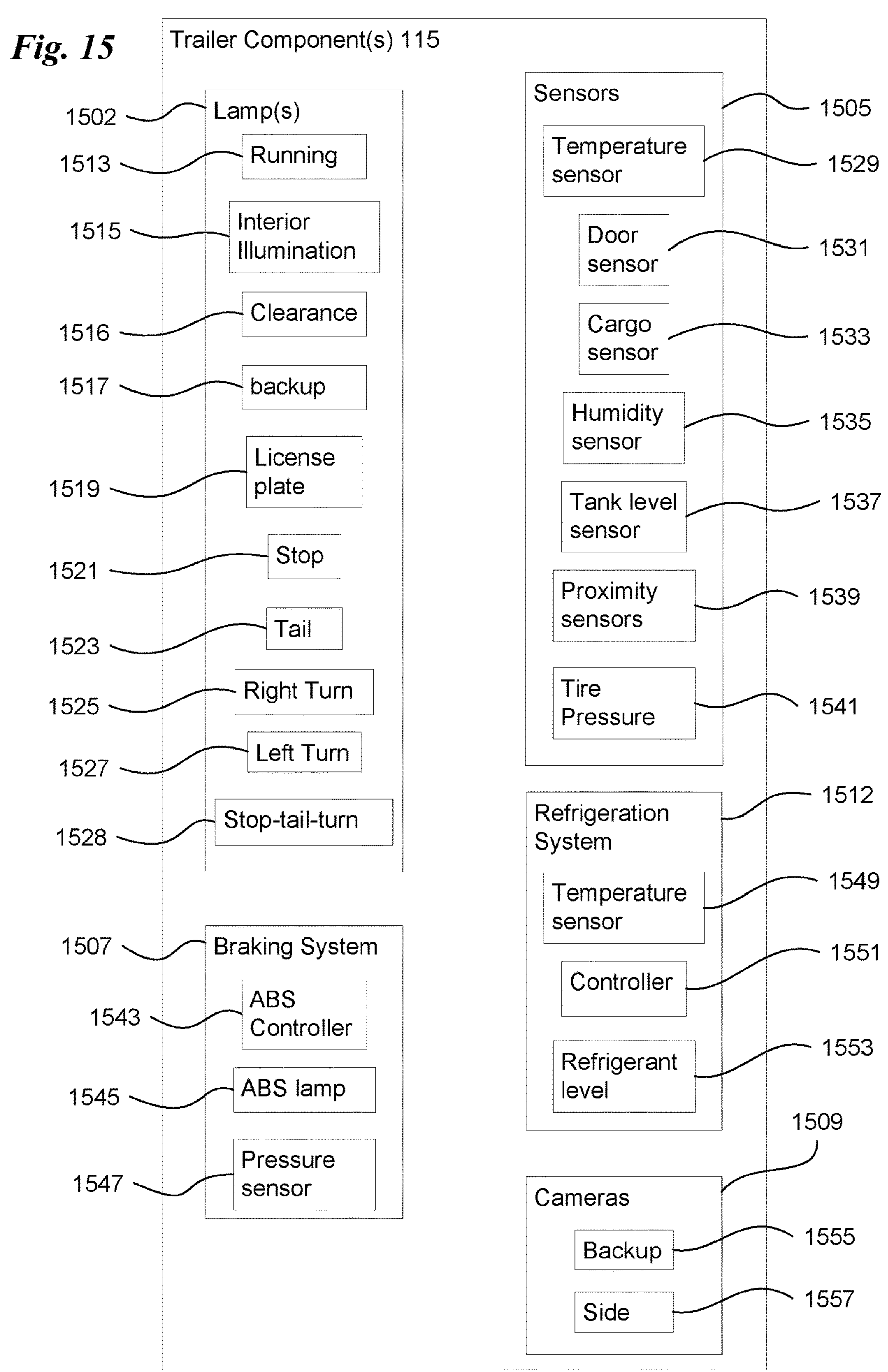
FIG. 15 is a component diagram illustrating examples of trailer components that may be used in conjunction with the adapter assemblies of the preceding figures.

Examples of trailer components 115 that may be electrically connected to adapter assemblies and cable systems like those discussed herein elsewhere are shown in FIG. 15. The trailer components 115 shown at 1500 in FIG. 15 are merely examples of components that might be included in a trailer 160, and should not be construed as an exhaustive list or as otherwise limiting the types of components envisioned. Other components may be included while some listed here may be excluded depending on the type of trailer and other factors.

The trailer components 1500 may include lamp(s) 1502, braking system 1507, sensors 1505, cameras 1509, and/or refrigeration system 1512. For example, lamp(s) 1502 may include, but are not limited to, running lamps 1513, interior illumination lamps 1515 for lighting the interior of the trailer, side marking/clearance/identification lamps 1516 for marking extremities of the trailer, backup 1517 for illuminating the area behind the trailer, license plate lamp(s) 1519 for lighting license plates and other identifying indicia mounted on the trailer, stop lamps 1521 that may illuminate when the vehicle is actively braking, tail lamps 1523, left turn lamps 1527 and right turn lamps 1525, and, stop-tail-turn 1528.

The sensors 1505 may include any of temperature sensor 1529 for sensing the temperature in and/or around 111, door sensor 1531 configured to optionally sense when trailer doors are open or closed, cargo sensor 1533 configured to optionally sense weight, location, and/or other attributes of cargo in or on 111, humidity sensor 1535 for optionally sensing absolute or relative humidity in and/or around trailer 103, tank level sensor 1537 optionally for sensing the level of fluids (liquids or gases) carried by 111, proximity sensor 1539 optionally for sensing proximity of 111 relative to nearby objects, and/or tire pressure sensor 1541 optionally for sensing pressure levels in tires of 111.

The braking system 1507 may optionally include an anti-lock Brakes (ABS) controller 1543 for controlling the ABS braking system, 1545 optionally for indicating the status or failure of the braking system 1507, and/or pressure sensor 1547 optionally included to sense changes in hydraulic or air pressure in braking system 1507. Other optional trailer components include cameras 1509 such as one or more backup cameras 1555 for optionally capturing a view of the surrounding area directly behind 111, and one or more side cameras 1557 for optionally capturing a view of areas adjacent the sides of 111.

Components of refrigeration system 1512 may include temperature sensor 1549 for determining the temperature inside the refrigerated cargo area of the trailer, controller 1551 configured to control the refrigeration cycle in the refrigeration system, and refrigerant level 1553 for determining the level of refrigerant in refrigeration system 1512.

Other examples of the disclosed concepts include the following numbered examples:

Example 1

An adapter for use with components of a trailer, comprising:
- multiple input terminals corresponding with multiple terminals of a trailer component socket of a trailer;
- multiple output terminals configured to electrically connect with corresponding input terminals of a trailer component; and
- an adapter circuit configured to electrically connect at least four of the input terminals with at least four of the multiple output terminals;
- wherein the multiple output terminals include at least two mode selection output terminals configured to provide a mode selection to the trailer component; and
- wherein the trailer component includes control logic configured to activate and deactivate the trailer component according to the mode selection.

Example 2

The adapter of example 1, wherein the multiple input terminals include:
- a power input terminal configured to electrically connect to a power circuit of the trailer;
- a ground input terminal configured to electrically connect to a ground circuit of the trailer; and
- at least one control input configured to electrically connect to at least one control cable of the trailer.

Example 3

The adapter of any preceding example, wherein the multiple output terminals include:
- a power output terminal configured to electrically connect a power terminal of a trailer component to the power input terminal, wherein the trailer component is mounted to the trailer;
- a ground connection terminal configured to electrically connect a ground terminal of the trailer component to the ground input terminal;
- at least one control output configured to electrically connect to the at least one control input of the trailer component; and
- wherein the at least two mode selection output terminals are configured to electrically connect to a corresponding at least two mode selection input terminal of the trailer component.

Example 4

The adapter of any preceding example, wherein the adapter circuit is configured to electrically connect the power input terminal to the power output terminal, the ground input terminal to the ground output terminal, and the at least one control input to the at least one control output, and wherein the adapter circuit is configured to provide a mode selection to the trailer component using the at least one mode selection output terminal.

Example 5

The adapter of any preceding example, comprising:

at least two mode selection output terminals electrically connected to at least two dual position switches;

wherein the dual position switches are configured to provide a mode selection by selectively connecting each of the at least two mode selection output terminals to either the power input terminal or the ground input terminal.

Example 6

The adapter of any preceding example, comprising:

a housing, wherein the at least two dual position switches extend outside the housing.

Example 7

The adapter of any preceding example, wherein the adapter circuit includes mode selection circuits electrically connecting each of the at least one mode selection output terminals to either the power input terminal or the ground input terminal.

Example 8

The adapter of any preceding example, comprising:

a wireless receiver configured to receive the mode selection from a remote computing device; and a memory configured to store the mode selection.

Example 9

The adapter of any preceding example, comprising:

a programming input terminal configured to accept the mode selection as input provided using a programming cable coupled to a remote computing device; and a memory configured to store the mode selection.

Example 10: The adapter of example 4, wherein the trailer component control logic includes a slave control circuit electrically connected to the power output terminal, the ground connection terminal, and the at least one control output, and wherein the slave control circuit is configured to receive control commands sent by a master control circuit;

wherein the slave control circuit is configured to activate the trailer component when the master control circuit sends a control command that matches the mode selection provided by the adapter circuit.

Example 11

The adapter of any preceding example, wherein the trailer component is a lamp, and wherein the mode selection is a brake mode.

Example 12

The adapter of any preceding example, wherein the trailer component is a rear-facing camera, and wherein the mode selection is a reverse mode.

Example 13

The adapter of any preceding example, wherein the power input terminal, the ground input terminal, and the at least one control output are electrically connected to a master control circuit mounted in a trailer nosebox of the trailer, wherein the master control circuit is configured to accept control input from a truck tractor, and wherein the master control circuit is configured to generate a component control command specific to the trailer component, and to deliver the component control command to the trailer component using at least one communication cable connection electrically connected to the at least one control output.

Example 14

The adapter of any preceding example:

wherein the at least one control cable of the trailer includes a first and second control cable;

wherein the first and second control cables are electrically connected to a master Control Area Network (CAN) controller;

wherein the trailer component includes a slave CAN controller electrically connected to the first and second control cables; and wherein the master and slave CAN controllers communicate using a CAN protocol.

Example 15

The adapter of any preceding example:

wherein the at least one control cable of the trailer includes a single control cable;

wherein the single control cable is electrically connected to a master Local Interconnect Network (LIN) controller;

wherein the trailer component includes a slave LIN controller electrically connected to the single control cable; and wherein the master and slave LIN controllers communicate using a LIN protocol.

Example 16

The adapter of any preceding example, wherein the trailer component is any one of a vehicle stop-tail-turn lamp, a vehicle turn signal lamp, a vehicle brake lamp, a vehicle tail lamp, a vehicle running lamp, a vehicle anti-lock brake, a vehicle interior illumination lamps, or a vehicle reverse lamp.

Example 17

The adapter of any preceding example, wherein the trailer component is an antilock brake system controller, a pressure sensor, a temperature sensor, a door sensor, a cargo sensor, a cargo a length sensor, a liquid level sensor, or a refrigeration sensor.

Glossary of Definitions and Alternatives

While examples of the inventions are illustrated in the drawings and described herein, this disclosure is to be considered as illustrative and not restrictive in character. The present disclosure is exemplary in nature and all changes, equivalents, and modifications that come within the spirit of the invention are included. The detailed description is included herein to discuss aspects of the examples illustrated in the drawings for the purpose of promoting an understanding of the principles of the inventions. No limitation of the scope of the inventions is thereby intended. Any alterations and further modifications in the described examples, and any further applications of the principles described herein are contemplated as would normally occur to one skilled in the art to which the inventions relate. Some examples are disclosed in detail, however some features that may not be relevant may have been left out for the sake of clarity.

Where there are references to publications, patents, and patent applications cited herein, they are understood to be incorporated by reference as if each individual publication, patent, or patent application were specifically and individually indicated to be incorporated by reference and set forth in its entirety herein.

Singular forms "a", "an", "the", and the like include plural referents unless expressly discussed otherwise. As an illustration, references to "a device" or "the device" include one or more of such devices and equivalents thereof.

Directional terms, such as "up", "down", "top" "bottom", "fore", "aft", "lateral", "longitudinal", "radial", "circumferential", etc., are used herein solely for the convenience of the reader in order to aid in the reader's understanding of the illustrated examples. The use of these directional terms does not in any manner limit the described, illustrated, and/or claimed features to a specific direction and/or orientation.

Multiple related items illustrated in the drawings with the same part number which are differentiated by a letter for separate individual instances, may be referred to generally by a distinguishable portion of the full name, and/or by the number alone. For example, if multiple "laterally extending elements" 90A, 90B, 90C, and 90D are illustrated in the drawings, the disclosure may refer to these as "laterally extending elements 90A-90D," or as "laterally extending elements 90," or by a distinguishable portion of the full name such as "elements 90".

The language used in the disclosure are presumed to have only their plain and ordinary meaning, except as explicitly defined below. The words used in the definitions included herein are to only have their plain and ordinary meaning. Such plain and ordinary meaning is inclusive of all consistent dictionary definitions from the most recently published Webster's and Random House dictionaries. As used herein, the following definitions apply to the following terms or to common variations thereof (e.g., singular/plural forms, past/present tenses, etc.):

"Activate" generally is synonymous with "providing power to", or refers to "enabling a specific function" of a circuit or electronic device that already has power.

"Address" generally refers to a label useful for identifying a location or thing. Examples include a specific region of memory in a computer from which data can be retrieved, or to which data can be stored. In the context of computer networks, an Internet Protocol address is a series of numbers used to uniquely identify a host on a network so that other computers connected to the network may direct data packets to a particular host. Similarly, in a Control Area Network (CAN) in a vehicle, addresses are used to direct the movement of data to individual nodes on the network.

"Anti-lock Braking System" generally refers to a vehicle safety system that allows the wheels on a motor vehicle (including trailers) to maintain tractive contact with the road surface according to driver inputs while braking, preventing the wheels from locking up (ceasing rotation) and avoiding uncontrolled skidding. ABS systems automatically apply the principles of threshold braking and cadence braking albeit a much faster rate and with better control than drivers can typically manage manually. ABS systems include wheel speed sensors to detect reduced wheel rotation indicative of impending wheel lock. An ABS controller is also included that can automatically actuate the braking system to reduce braking force on the affected wheel or wheels, and to quickly reapply braking force when the danger of wheel lock is reduced. This overall feedback loop may be executed multiple times a second resulting in rapid activation and deactivation of braking force or "pulsing" of the brakes.

Maximum braking force is obtained with approximately 10-20% slippage between the braked wheel's rotational speed and the road surface. Beyond this point, rolling grip diminishes rapidly and sliding friction provides a greater proportion of the force that slows the vehicle. Due to local heating and melting of the tires, the sliding friction can be very low. When braking at, or beyond, the peak braking force, steering input is largely ineffective since the grip of the tire is entirely consumed in braking the vehicle.

Threshold braking seeks to obtain peak friction by maintaining the maximum braking force possible without allowing wheels to slip excessively. Braking beyond the slipping point causes tires to slide and the frictional adhesion between the tire and driving surface is thus reduced. The aim of threshold braking is to keep the amount of tire slip at the optimal amount, the value that produces the maximum frictional, and thus braking force. When wheels are slipping significantly (kinetic friction), the amount of friction available for braking is typically substantially less than when the wheels are not slipping (static friction), thereby reducing the braking force. Peak friction occurs between the static and dynamic endpoints, and this is the point that threshold braking tries to maintain.

"Cadence" braking or "stutter" braking involves pumping the brake pedal and is used to allow a car to both steer and brake on a slippery surface. ABS systems generally provide this behavior automatically and at a much higher rate than most drivers can manually produce. It is used to effect an emergency stop where traction is limited to reduce the effect of skidding from road wheels locking up under braking. This can be a particular problem when different tires have different traction, such as on patchy ice for example. Cadence braking maximizes the time for the driver to steer around the obstacle ahead, as it allows the driver to steer while slowing.

ABS generally offers improved vehicle control and decreases stopping distances on dry and slippery surfaces; however, on loose gravel or snow-covered surfaces, ABS can significantly increase braking distance, although still improving vehicle steering control.

"Backup Camera" generally refers to a rear facing camera mounted to a vehicle or trailer for the purpose of capturing images of the area directly behind the vehicle.

"Brake Lamp" or "Stop Lamp" generally refers to a lamp mounted at or near the rear of a vehicle or trailer that is configured to illuminate when the vehicle or trailer brakes are applied so as to warn others that the vehicle is slowing. Brake lamps are commonly mounted at the rear of the vehicle or trailer and are generally configured to emit red light. As used herein, the term generally refers to a stop lamp which is compliant with present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108

"Brake Mode" generally refers to a specific vehicle mode that is activated when the vehicle is slowed by an application of the braking system. This mode may be activated only briefly e.g. tapping the brakes or it may be activated and held for any amount of time e.g. sitting in stopped traffic.

"Cable" generally refers to one or more elongate strands of material that may be used to carry electromagnetic or electrical energy. A metallic or other electrically conductive material may be used to carry electric current. In another example, strands of glass, acrylic, or other substantially transparent material may be included in a cable for carrying light such as in a fiber-optic cable. A cable may include connectors at each end of the elongate strands for connecting to other cables to provide additional length. A cable is generally synonymous with a node in an electrical circuit and provides connectivity between elements in a circuit but does not include circuit elements. Any voltage drop across a cable is therefore a function of the overall resistance of the material used.

A cable may include a sheath or layer surrounding the cable with electrically non-conductive material to electrically insulate the cable from inadvertently electrically connecting with other conductive material adjacent the cable.

A cable may include multiple individual component cables, wires, or strands, each with, or without, a non-conductive sheathing. A cable may also include a non-conductive sheath or layer around the conductive material, as well as one or more layers of conductive shielding material around the non-conductive sheath to capture stray electromagnetic energy that may be transmitted by electromagnet signals traveling along the conductive material of the cable, and to insulate the cable from stray electromagnetic energy that may be present in the environment the cable is passing through. Examples of cables include twisted pair cable, coaxial cable, "twin-lead", fiber-optic cable, hybrid optical and electrical cable, ribbon cables with multiple side-by-side wires, and the like.

Cable System" generally refers to one or more cables configured to operate together to achieve a result. For example, a cable system includes multiple cables or conductors operating together to carry electromagnetic energy. Examples of this include twisted pair network cables for carrying data over a network, coaxial cable carrying radio signals from a transmitter to an antenna, multiple wires carrying power to different parts of a vehicle such as a truck or a trailer, or three-wire AC wiring such as what is commonly found in homes for the purpose of carrying power. Cable systems may also be used to achieve a result in a mechanical context, such as in the case of a cable-stayed bridge where one or more cables are used to support a bridge, or in the case of a crane that may use one or more cables to lift and/or move a load.

"Cargo Sensor" generally refers to sensors configured to determine whether at least a portion of a trailer is loaded or unloaded. Any suitable sensing technology may be used for this purpose. Examples include cargo sensors that use ultrasonic detection, optical image analysis of the cargo area, or laser time-of-flight measurements for detecting the presence of cargo within a cargo area.

"Computer" or "Computing Device" generally refers to a device configured to compute a result from any number of input values or variables. A computer may include a processor for performing calculations to process input or output. A computer may include a memory for storing values to be processed by the processor, or for storing the results of previous processing.

A computer may also be configured to accept input and output from a wide array of input and output devices for receiving or sending values. Such devices include other computers, keyboards, mice, visual displays, printers, industrial equipment, and systems or machinery of all types and sizes. For example, a computer can control a network or network interface to perform various network communications upon request. The network interface may be part of the computer, or characterized as separate and remote from the computer.

A computer may be a single, physical, computing device such as a desktop computer, a laptop computer, or may be composed of multiple devices of the same type such as a group of servers operating as one device in a networked cluster, or a heterogeneous combination of different computing devices operating as one computer and linked together by a communication network. The communication network connected to the computer may also be connected to a wider network such as the internet. Thus a computer may include one or more physical processors or other computing devices or circuitry, and may also include any suitable type of memory.

A computer may also be a virtual computing platform having an unknown or fluctuating number of physical processors and memories or memory devices. A computer may thus be physically located in one geographical location or physically spread across several widely scattered locations with multiple processors linked together by a communication network to operate as a single computer.

The concept of "computer" and "processor" within a computer or computing device also encompasses any such processor or computing device serving to make calculations or comparisons as part of the disclosed system. Processing operations related to threshold comparisons, rules comparisons, calculations, and the like occurring in a computer may occur, for example, on separate servers, the same server with separate processors, or on a virtual computing environment having an unknown number of physical processors as described above.

A computer may be optionally coupled to one or more visual displays and/or may include an integrated visual display. Likewise, displays may be of the same type, or a heterogeneous combination of different visual devices. A computer may also include one or more operator input devices such as a keyboard, mouse, touch screen, laser or infrared pointing device, or gyroscopic pointing device to name just a few representative examples. Also, besides a display, one or more other output devices may be included such as a printer, plotter, industrial manufacturing machine, 3D printer, and the like. As such, various display, input and output device arrangements are possible.

Multiple computers or computing devices may be configured to communicate with one another or with other devices over wired or wireless communication links to form a network. Network communications may pass through various computers operating as network appliances such as switches, routers, firewalls or other network devices or interfaces before passing over other larger computer networks such as the internet. Communications can also be passed over the network as wireless data transmissions carried over electromagnetic waves through transmission lines or free space. Such communications include using WiFi or other Wireless Local Area Network (WLAN) or a cellular transmitter/receiver to transfer data.

"Communication cable" generally refers to a cable configured to carry digital or analog signals.

"Communication Link" generally refers to a connection between two or more communicating entities and may or may not include a communications channel between the communicating entities. The communication between the communicating entities may occur by any suitable means. For example, the connection may be implemented as a physical link, an electrical link, an electromagnetic link, a logical link, or any other suitable linkage facilitating communication.

In the case of a physical link, communication may occur by multiple components in the communication link configured to respond to one another by physical movement of one element in relation to another. In the case of an electrical link, the communication link may be composed of multiple electrical conductors electrically connected to form the communication link.

In the case of an electromagnetic link, the connection may be implemented by sending or receiving electromagnetic energy at any suitable frequency, thus allowing communications to pass as electromagnetic waves. These electromagnetic waves may or may not pass through a physical medium such as an optical fiber, or through free space via one or more sending and receiving antennas, or any combination thereof. Electromagnetic waves may be passed at any suitable frequency including any frequency in the electromagnetic spectrum.

A communication link may include any suitable combination of hardware which may include software components as well. Such hardware may include routers, switches, networking endpoints, repeaters, signal strength enters, hubs, and the like.

In the case of a logical link, the communication link may be a conceptual linkage between the sender and recipient such as a transmission station in the receiving station. Logical link may include any combination of physical, electrical, electromagnetic, or other types of communication links.

"Comparison Logic" generally refers to software or electronic circuits configured to compare two or more values and determine a result based on one or more rules. The rules may be encoded as software executed on a processor in a computer, or encoded by an arrangement of digital or analog logic gates or circuits. Examples include if-then decision trees, comparisons made based on the relationships between sets of values, decision logic implemented in a neural network, fuzzy logic for determine partial truth results, and the like.

"Control Area Network (CAN)" or "CAN bus" generally refers to a communication system and network protocol that may be used for intercommunication between components or subsystems of a vehicle. A CAN (sometimes referred to colloquially as a "CAN bus") allows one or more microcontrollers or CAN enabled devices to communicate with each other in real time without a host computer. A CAN may physically connect all nodes together through a two wire bus. The wires may be a twisted pair cable with a 120 ohm characteristic impedance. These wires may be thought of as "high" and "low" connections.

CAN may be thought of as an example of a multi-master serial bus for connecting Electronic Control Units (ECUs) also referred to as "nodes". Two or more nodes are required on the CAN network to communicate. The complexity of the node can range from a simple I/O device such as a sensor, an active device such as a lamp, transmission, or brake actuator, or an embedded computer or ECU with a CAN interface. A node may also be a gateway allowing a standard computer to communicate over a network connection such as a Universal Serial Bus (USB) or Ethernet port allowing outside devices to be selectively added or removed from the CAN network.

A CAN bus does not require any addressing schemes, as the nodes of the network use unique identifiers that may be provided by programming the individual node before use, or reprogramming between uses. This provides the nodes with information regarding the priority and the urgency of transmitted message.

Each node may include a central processing unit, microprocessor, or host processor. The host processor may be configured to determine what the received messages mean and what messages to transmit in response. A node may be electrically connect to sensors, actuators, lamps, or other electronic devices that can be connected to the host processor. A node may also include a CAN controller, optionally integrated into the microcontroller. The can control may implement the sending and receiving protocols. When receiving, the CAN controller may store the received serial bits from the bus until an entire message is available, which can then be fetched by the host processor (for example, by the CAN controller triggering an interrupt). When sending, the host processor may send the transmit message(s) to the CAN controller, which transmits the bits serially onto the bus when the bus is free. A node may also include a transceiver. When receiving: the transceiver may convert the data stream from CAN bus levels to levels that the CAN controller uses. It may have protective circuitry to protect the CAN controller. When transmitting, the transceiver may convert the data stream from the CAN controller to CAN bus levels.

Each node may be configured to send and receive messages, but not simultaneously. A message or Frame consists primarily of the ID (identifier), which represents the priority of the message, and up to eight data bytes. A CRC, acknowledge slot (ACK) and other overhead are also part of the message. The improved CAN FD extends the length of the data section to up to 64 bytes per frame. The message is transmitted serially onto the bus using a non-return-to-zero (NRZ) format and may be received by all nodes.

CAN data transmission may use a lossless bitwise arbitration method of contention resolution. This arbitration method may require all nodes on the CAN network to be synchronized to sample every bit on the CAN network at the same time. Thus data may be transmitted without a clock signal in an asynchronous format.

The CAN specifications may use the terms "dominant" bits and "recessive" bits where dominant is a logical 0 (actively driven to a voltage by the transmitter) and recessive is a logical 1 (passively returned to a voltage by a resistor). The idle state may be represented by the recessive level (logical 1). If one node transmits a dominant bit and another node transmits a recessive bit then a collision results and the dominant bit "wins". This means there is no delay to the higher-priority message, and the node transmitting the lower priority message automatically attempts to retransmit, for example, six bit clocks after the end of the dominant message.

All nodes on the CAN network generally operate at the same nominal bit rate, but noise, phase shifts, oscillator tolerance and oscillator drift mean that the actual bit rate may not be the same as the nominal bit rate. Since a separate clock signal is not used, a means of synchronizing the nodes is used. Synchronization is helpful during arbitration since the nodes in arbitration may see both their transmitted data and the other nodes' transmitted data at the same time. Synchronization is also helpful to ensure that variations in oscillator timing between nodes do not cause errors.

Synchronization may start with a hard synchronization on the first recessive to dominant transition after a period of bus idle (the start bit). Resynchronization may occur on every recessive to dominant transition during the frame. The CAN controller may expect the transition to occur at a multiple of the nominal bit time. If the transition does not occur at the exact time the controller expects it, the controller adjusts the nominal bit time accordingly.

Examples of lower-layer (e.g. levels 1 and 2 of the ISO/OSI model), are commercially available from the International Standardization Organization (ISO) and include ISO 11898-1 through 11898-6, as well as ISO 16845-1 and 16845-2.

CAN standards may not include application layer protocols, such as flow control, device addressing, and transportation of data blocks larger than one message, as well as, application data. Other CAN standards are available that are optimized for specific fields of use. These include, but are not limited to:

- ARINC 812 or ARINC 825 (for the aviation industry)
- CANopen-EN 50325-4 (used for industrial automation)
- DeviceNet (used for industrial automation)
- EnergyBus-CiA 454 (used for light electrical vehicles)
- ISOBUS-ISO 11783 (agriculture)
- ISO-TP-ISO 15765-2 (Transport protocol for automotive diagnostic)
- SAE J1939 (In-vehicle network for buses and trucks)
- MilCAN
- NMEA 2000-IEC 61162-3 (marine industry)
- Unified Diagnostic Services (UDS)-ISO 14229 (automotive diagnostics)
- CANaerospace-Stock (for the aviation industry)
- CAN Kingdom-Kvaser (embedded control system)
- CCP/XCP (automotive ECU calibration)
- GMLAN-General Motors (for General Motors)
- RV-C-RVIA (used for recreational vehicles)
- SafetyBUS p-Pilz (used for industrial automation)
- UAVCAN (aerospace and robotics)

"Controller" or "Control Circuit" generally refers to a mechanical or electronic device configured to control the behavior of another mechanical or electronic device. A controller or a control circuit may be configured to provide signals or other electrical impulses that may be received and interpreted by the controlled device to indicate how it should behave. Controllers or control circuits may control other controllers or control circuits such as in a master-slave configuration where the master is configured to control a slave based on input from the master.

"Control Logic" generally refers to hardware or software configured to implement an automatic decision making process by which inputs are considered, and corresponding outputs are generated. The output may be used for any suitable purpose such as to provide specific commands to machines or processes specifying specific actions to take. Examples of control logic include computer programs executed by a processor to accept commands from a user and generate output according to the logic implemented in the program as executed by the processor. In another example, control logic may be implemented as a series of logic gates, microcontrollers, and the like, electrically connected together in a predetermined arrangement so as to accept input from other circuits or computers and produce an output according to the rules implemented in the logic circuits.

"Data" generally refers to one or more values of qualitative or quantitative variables that are usually the result of measurements. Data may be considered "atomic" as being finite individual units of specific information. Data can also be thought of as a value or set of values that includes a frame of reference indicating some meaning associated with the values. For example, the number "2" alone is a symbol that absent some context is meaningless. The number "2" may be considered "data" when it is understood to indicate, for example, the number of items produced in an hour.

Data may be organized and represented in a structured format. Examples include a tabular representation using rows and columns, a tree representation with a set of nodes considered to have a parent-children relationship, or a graph representation as a set of connected nodes to name a few.

The term "data" can refer to unprocessed data or "raw data" such as a collection of numbers, characters, or other symbols representing individual facts or opinions. Data may be collected by sensors in controlled or uncontrolled environments, or generated by observation, recording, or by processing of other data. The word "data" may be used in a plural or singular form. The older plural form "datum" may be used as well.

"Door Sensor" generally refers to a sensor configured to detect whether a door is open or closed. Such sensors may be installed in vehicles, homes, businesses, and may be part of a security or monitoring system. Such sensors may include optical or mechanical switches, proximity sensors, or other such devices for detecting the position of a door from an open versus closed configuration.

"Dual Position Switch" generally refers to an electronic device that has two operating conditions. In one position the switch is "Open" and no connection is made across the terminals in the switch, and thus no power can flow through the switch. In the "Closed" position the switch terminals are connected and power can flow through the switch. Examples include mechanical switches such as Single Pole Single Throw (SPST) switches, Dual Pole Dual Throw (DPDT) switches. For example, two position mechanical switches such as Dual Inline Package (DIP) switches may be are arranged together in a single package with multiple individual dual position switches that are mechanically actuated between open and closed positions. In the closed position the contacts are physically touching and thus a circuit is completed and power can flow through the switch. In the open position the contacts are physically separated far enough apart to break the circuit thus interrupting the flow of power.

In another example, many solid-state devices such as a Bipolar Junction Transistor (BJT), a Metal Oxide Semiconducting Field Effect Transistor (MOSFET), or other similar to devices operate as dual position switches where the switching mechanism is actuated electromagnetically rather than by physically contacting two parts of a circuit together.

"Electrically connected" generally refers to a configuration of two objects that allows electricity to flow between them or through them. In one example, two conductive materials are physically adjacent one another and are sufficiently close together so that electricity can pass between them. In another example, two conductive materials are in physical contact allowing electricity to flow between them.

"Ground" or "circuit ground" generally refers to a node in an electrical circuit that is designated as a reference node for other nodes in a circuit. It is a reference point in an electrical circuit from which voltages are measured, a common return path for electric current, and/or a direct physical connection to the Earth.

"Ground cable" generally refers to a cable electrically connecting to a circuit ground.

"J-560 Compliant cabling system" generally refers to a cable system with multiple individual wires forming separate circuits in a truck trailer conforming to the Society of Automotive Engineers (SAE) J-560 standard. The J-560 standard requires an 8 AWG chassis ground wire, typically colored white, a 10 AWG wire (typically red) that is dedicated to brake or stop lamps, and a 10 AWG wire (often blue)

that is dedicated to provide continuous ABS primary power and, alternatively, power for auxiliary devices. Four 12 AWG wires are commonly included (such as the yellow, green, brown, and black) wires, with the yellow wire dedicated to the left turn signal and hazard lamps, the green wire dedicated to the right turn signal and hazard lamps, the brown wire dedicated for tail and license plates and clearance and/or side marker lamps, and the black wire dedicated for clearance, side marker, and identification lamps. Thus, the conventional J-560 compliant cable system has an aggregate cross-sectional area of about 32 $mm^2$ calculated as the aggregate of four metallic 12 AWG cables each with a cross-sectional area of 3.3 $mm^2$, two metallic 10 AWG cables each with a cross-sectional area of 5.3 $mm^2$, one metallic 8 AWG cables each with a cross-sectional area of 8.4 $mm^2$.

"Lamp" generally refers to an electrical device configured to produce light using electrical power. The generated light may be in the visible range, ultraviolet, infrared, or other light. Example illumination technologies that may be employed in a lamp include, but are not limited to, incandescent, halogen, LED, fluorescent, carbon arc, xenon arc, metal-hallide, mercury-vapor, sulfur, neon, sodium-vapor, or others.

"Light Emitting Diode" or "LED" generally refers to a diode that is configured to emit light when electrical power passes through it. The term may be used to refer to single diodes as well as arrays of LED's and/or grouped light emitting diodes. This can include the die and/or the LED film or other laminate, LED packages, said packages may include encapsulating material around a die, and the material, typically transparent, may or may not have color tinting and/or may or may not have a colored sub-cover. An LED can be a variety of colors, shapes, sizes and designs, including with or without heat sinking, lenses, or reflectors, built into the package.

"Liquid Level Sensor" generally refers to a sensor to measure the depth of liquid in a container. Examples include optical level switches, ultrasonic sensors, float switches, and conductive sensors to name a few non-limiting examples.

"LED Lamp" generally refers to an electrical device that uses Light Emitting Diodes (LEDs) to produce light using electrical power. A lamp may include a single LED, or multiple LEDs.

"LED fault signal" generally refers to a signal that is used to indicate the failure of an LED. The LED fault signal can take the form of power to illuminate a fault LED, a data message (such as via a serial communication protocol or other), a mechanical indicator, or other. The LED fault signal can be used to communicate a failed LED to an onboard computer or display system such as may be found in the cabin of a vehicle or a trailer.

"Local Interconnect Network (LIN)" generally refers to a network protocol used for communication between components in vehicles, usually by means of serial communication. LIN may be used also over the vehicle's battery power-line with a special LIN over DC powerline (DC-LIN) transceiver. Features of the protocol include, but are not limited to a single master, up to 16 slaves, Slave Node Position Detection (SNPD) that allows node address assignment after power-up, single wire communications greater than 19.2 Kbits/s with a bus length of 40 meters or less, guaranteed latency times, variable length of data frame (2, 4 and 8 byte frames), multi-cast reception with time synchronization, without crystals or ceramic resonators, data checksum and error detection, detection of defective nodes, and an operating voltage of 12V.

A LIN may be implemented as a single-wire network such as an asynchronous serial network described on ISO 9141. A microcontroller may generate all needed LIN data by software and is connected to the LIN network via a LIN transceiver. The LIN Master may use one or more predefined scheduling tables to start sending and receiving to the LIN bus. These scheduling tables contain relative timing information, where the message sending is initiated. One LIN Frame consists of the two parts header and response. The header is always sent by the LIN Master, while the response is sent by either one dedicated LIN-Slave or the LIN master itself.

Transmitted data within the LIN is transmitted serially as eight bit data bytes with one start bit, one stop-bit, and no parity (break field does not have a start bit and stop bit). Bit rates vary within the range of 1 kbit/s to 20 kbit/s, or more. Data on the bus is divided into recessive (logical HIGH) and dominant (logical LOW). The time normal is considered by the LIN Masters stable clock source, the smallest entity is one bit time (e.g. 52 us at 19.2 kbit/s).

Data may be transferred across the bus in fixed form messages of selectable lengths. The master task may transmit a header that consists of a break signal followed by synchronization and identifier fields. The slaves may respond with a data frame that consists of between 2, 4 and 8 data bytes plus 3 bytes of control information. Frame types include, unconditional frame, Event-triggered frame, Sporadic frame, Diagnostic frame, User-defined frame, Reserved frame. One example of a standard LIN is maintained by the International Organization for Standardization (ISO) as ISO/AWI 17987

"Maintenance Interface" generally refers to software or hardware configured perform maintenance functions. This may include establishing and/or maintain communication links with remote computing devices. Such communication links may be wired or wireless, and may be used for any suitable maintenance purpose such as to send information to the remote computing device, and to retrieve updated software such as in the case of firmware upgrade delivered wirelessly. A maintenance interface may include a wireless module or interface with software for managing the specific tasks of maintaining a wireless connection to a computer network in order to perform the maintenance functions.

"Master/Slave" generally refers to a model for a communication protocol in which one device or process (known as the master) controls one or more other devices or processes (known as slaves). In some implementations, such as in a Local Interconnect Network (LIN) only one node in a communication network may operate as a master and once the master/slave relationship is established, the direction of control is always from the master to the slave(s). In other examples, such as in the case of a Control Area Network (CAN), the concept of a master and slave is less strict because all nodes on the CAN may operate as a "master" issuing commands to other "master" nodes. As used herein, a master sends commands to a slave, irrespective of whether the networking protocol used strictly adheres to this requirement.

"Memory" generally refers to any storage system or device configured to retain data or information. Each memory may include one or more types of solid-state electronic memory, magnetic memory, or optical memory, just to name a few. Memory may use any suitable storage technology, or combination of storage technologies, and may be volatile, nonvolatile, or a hybrid combination of volatile and nonvolatile varieties. By way of non-limiting example, each memory may include solid-state electronic Random Access Memory (RAM), Sequentially Accessible Memory (SAM) (such as the First-In, First-Out (FIFO) variety or the Last-In-First-Out (LIFO) variety), Programmable Read Only Memory (PROM), Electronically Programmable Read Only Memory (EPROM), or Electrically Erasable Programmable Read Only Memory (EEPROM).

Memory can refer to Dynamic Random Access Memory (DRAM) or any variants, including static random access memory (SRAM), Burst SRAM or Synch Burst SRAM (BSRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (REDO DRAM), Single Data Rate Synchronous DRAM (SDR SDRAM), Double Data Rate SDRAM (DDR SDRAM), Direct Rambus DRAM (DRDRAM), or Extreme Data Rate DRAM (XDR DRAM).

Memory can also refer to non-volatile storage technologies such as non-volatile read access memory (NVRAM), flash memory, non-volatile static RAM (nvSRAM), Ferroelectric RAM (FeRAM), Magnetoresistive RAM (MRAM), Phase-change memory (PRAM), conductive-bridging RAM (CBRAM), Silicon-Oxide-Nitride-Oxide-Silicon (SONOS), Resistive RAM (RRAM), Domain Wall Memory (DWM) or “Racetrack” memory, Nano-RAM (NRAM), or Millipede memory. Other non-volatile types of memory include optical disc memory (such as a DVD or CD ROM), a magnetically encoded hard disc or hard disc platter, floppy disc, tape, or cartridge media. The concept of a “memory” includes the use of any suitable storage technology or any combination of storage technologies.

“Metallic” generally refers to a material that includes a metal, or is predominately (50% or more by weight) a metal. A metallic substance may be a single pure metal, an alloy of two or more metals, or any other suitable combination of metals. The term may be used to refer to materials that include nonmetallic substances. For example, a metallic cable may include one or more strands of wire that are predominately copper sheathed in a polymer or other non-conductive material.

“Microcontroller” or “MCU” generally refers to a small computer on a single integrated circuit. It may be similar to, but less sophisticated than, a System on a Chip or “SoC”; an SoC may include a microcontroller as one of its components. A microcontroller may contain one or more CPUs (processor cores) along with memory and programmable input/output peripherals. Program memory in the form of ferroelectric RAM, NOR flash or OTP ROM may also be included on the chip, as well as a small amount of RAM. Microcontrollers may be designed for embedded applications, in contrast to the microprocessors used in personal computers or other general purpose applications consisting of various discrete chips.

Microcontrollers may be included in automatically controlled products and devices, such as automobile engine control systems, implantable medical devices, remote controls, office machines, appliances, power tools, toys and other embedded systems. An MCU may be configured to handle mixed signals thus integrating analog components needed to control non-digital electronic systems.

Some microcontrollers may use four-bit words and operate at frequencies as low as 4 kHz, for low power consumption (single-digit milliwatts or microwatts). They will generally have the ability to retain functionality while waiting for an event such as a button press or other interrupt; power consumption while sleeping (CPU clock and most peripherals off) may be just nanowatts, making many of them well suited for long lasting battery applications. Other microcontrollers may serve performance roles, where they may need to act more like a Digital Signal Processor (DSP), with higher clock speeds and power consumption. A microcontroller may include any suitable combination of circuits such as:

1. a central processing unit-ranging from small and simple processors with registers as small as 4 bits or list, to complex processors with registers that are 32, 64, or more bits
2. volatile memory (RAM) for data storage
3. ROM, EPROM, EEPROM or Flash memory for program and operating parameter storage
4. discrete input and output bits, allowing control or detection of the logic state of an individual package pin
5. serial input/output such as serial ports (UARTs)
6. other serial communications interfaces like I2C, Serial Peripheral Interface and Controller Area Network for system interconnect
7. peripherals such as timers, event counters, PWM generators, and watchdog
8. clock generator-often an oscillator for a quartz timing crystal, resonator or RC circuit
9. many include analog-to-digital converters, some include digital-to-analog converters
10. in-circuit programming and in-circuit debugging support “Mode Selector” generally refers to a device configured to provide input useful for selecting an operating mode for a system, or a device operating within the system. In one example, the mode selector is an array of physical switches that together may be used to specify a string of binary data that may be used to identify a selected mode. The selected mode may be changed by adjusting the position of the switches. In another example, a mode selector may be a software program or logic circuit configured to adjust a data value stored in memory and to update that data value when other devices seek to adjust the current operating mode.

“Mode Identifier” generally refers to a physical or logical indicator that identifies the operational mode for a device or a system. Examples include a string of binary bits stored in a memory represented as a number or string of characters identifying current mode. In another example, physical arrangement of dual position switches may operate as a mode identifier.

“Multiple” as used herein is synonymous with the term “plurality” and refers to more than one, or by extension, two or more.

“Network” or “Computer Network” generally refers to a telecommunications network that allows computers to exchange data. Computers can pass data to each other along data connections by transforming data into a collection of datagrams or packets. The connections between computers and the network may be established using either cables, optical fibers, or via electromagnetic transmissions such as for wireless network devices.

Computers coupled to a network may be referred to as “nodes” or as “hosts” and may originate, broadcast, route, or accept data from the network. Nodes can include any computing device such as personal computers, phones, servers as well as specialized computers that operate to maintain the flow of data across the network, referred to as “network devices”. Two nodes can be considered “networked together” when one device is able to exchange information with another device, whether or not they have a direct connection to each other.

Examples of wired network connections may include Digital Subscriber Lines (DSL), coaxial cable lines, or optical fiber lines. The wireless connections may include BLUETOOTH, Worldwide Interoperability for Microwave Access (WiMAX), infrared channel or satellite band, or any wireless local area network (Wi-Fi) such as those implemented using the Institute of Electrical and Electronics Engineers' (IEEE) 802.11 standards (e.g. 802.11(a), 802.11 (b), 802.11(g), or 802.11(n) to name a few). Wireless links may also include or use any cellular network standards used to communicate among mobile devices including 1G, 2G, 3G, or 4G. The network standards may qualify as 1G, 2G, etc. by fulfilling a specification or standards such as the specifications maintained by International Telecommunication Union (ITU). For example, a network may be referred to as a "3G network" if it meets the criteria in the International Mobile Telecommunications-2000 (IMT-2000) specification regardless of what it may otherwise be referred to. A network may be referred to as a "4G network" if it meets the requirements of the International Mobile Telecommunications Advanced (IMTAdvanced) specification. Examples of cellular network or other wireless standards include AMPS, GSM, GPRS, UMTS, LTE, LTE Advanced, Mobile WiMAX, and WiMAX-Advanced.

Cellular network standards may use various channel access methods such as FDMA, TDMA, CDMA, or SDMA. Different types of data may be transmitted via different links and standards, or the same types of data may be transmitted via different links and standards.

The geographical scope of the network may vary widely. Examples include a body area network (BAN), a personal area network (PAN), a low power wireless Personal Arca Network using IPv6 (6LoWPAN), a local-area network (LAN), a metropolitan area network (MAN), a wide area network (WAN), or the Internet.

A network may have any suitable network topology defining the number and use of the network connections. The network topology may be of any suitable form and may include point-to-point, bus, star, ring, mesh, or tree. A network may be an overlay network which is virtual and is configured as one or more layers that use or "lay on top of" other networks.

A network may utilize different communication protocols or messaging techniques including layers or stacks of protocols. Examples include the Ethernet protocol, the internet protocol suite (TCP/IP), the ATM (Asynchronous Transfer Mode) technique, the SONET (Synchronous Optical Networking) protocol, or the SDE1 (Synchronous Digital Elierarchy) protocol. The TCP/IP internet protocol suite may include application layer, transport layer, internet layer (including, e.g., IPv6), or the link layer.

"Nosebox" generally refers to an enclosure that serves a junction for electronic circuits and/or physical connections running between a truck and a trailer. The nosebox is generally located towards the front of the trailer, but may be positioned in any suitable location on the trailer. The nosebox can be one single enclosure, or may include multiple separate enclosures located in the same or in separate locations located on the trailer. The nosebox generally provides a common ground circuit between the truck and the trailer cable system. It may also provide a single location on the trailer by which the trailer cable system may electrically connect with one or more power circuits provided by the truck. For example, a nose box may provide a J-560 compliant connection, or alternatively, a nose box may include a four pin, five pin, or other similar connections.

"Operating Mode" or "Mode" generally refers to an identifiable state of operation. It may be thought of as being in the act of operating in a predetermined manner, or in the midst of following a course of conduct, or line of action. In another example, a mode as used herein refers to the process of acting according to a definite procedural means, method, or methodology, a plan of action, practice, or procedure, a strategy, tactic, technique, or means to an end.

An operating mode need not involve a predetermined fixed series of steps or operations. An operating mode may, for example, include decision making algorithms which are fixed, but lead to non-deterministic actions or results based on new facts. In another example, an operating mode may include decision making algorithms which change over time yielding deterministic results that differ based on similar inputs.

Examples of operating modes include, a lamp that is off, or is in the "off" mode, a lamp that is in the "flashing mode" which involves intermittent activation and deactivation of power to the lamp, an unmoving truck with the transmission in "reverse mode" ready to move backward, a camera that is "on" but "not recording", and the like.

"Optionally" as used herein means discretionary; not required; possible, but not compulsory; left to personal choice.

"Outage Detection Circuit" generally refers to a circuit configured to detect unusual conditions in components connected to a circuit and thereby to determine whether the component has failed. For example, an outage detection circuit may be configured to detect when an individual LED has failed, or when a significant number of individual LEDs in an LED lamp connected to a trailer cable system have failed requiring replacement of the entire LED lamp.

"Pigtail" generally refers to a cable that has a connector on one end and loose wires on the other. It is designed to patch into an existing line or to terminate the ends of wire or bundle of wires.

"Polymeric Material" or "Polymer" generally refers to naturally occurring and synthetic materials characterized by a molecular structure formed from the repetition of subunits bonded together. Examples include, but are not limited to, naturally occurring substances such as amber, silk, hemp, and many kinds of synthetic substances such polyethylene, polypropylene, polystyrene, polyvinyl chloride, synthetic rubber, phenol formaldehyde resin (or Bakelite), neoprene, nylon, polyacrylonitrile, silicone, and the like.

"Predominately" as used herein is synonymous with greater than 50%.

"Pressure Sensor" generally refers to a device configured to detect pressure applied to the device. Such devices generally include a pressure sensitive element to determine the actual pressure applied to the sensor and may also include components configured to convert this information into an output signal. Examples of pressure sensors include strain gauge based sensors, capacitive sensors, piezo-resistive pressure sensors, resonant pressure sensors and the like.

"Processor" generally refers to one or more electronic components configured to operate as a single unit configured or programmed to process input to generate an output. Alternatively, when of a multi-component form, a processor may have one or more components located remotely relative to the others. One or more components of each processor may be of the electronic variety defining digital circuitry, analog circuitry, or both. In one example, each processor is of a conventional, integrated circuit microprocessor arrangement, such as one or more PENTIUM, i3, i5 or i7 processors supplied by INTEL Corporation of Santa Clara, California, USA. Other examples of commercially available processors include but are not limited to the X8 and Freescale Coldfire processors made by Motorola Corporation of Schaumburg, Illinois, USA; the ARM processor and TEGRA System on a Chip (SoC) processors manufactured by Nvidia of Santa Clara, California, USA; the POWER7 processor manufactured by International Business Machines of White Plains, New York, USA; any of the FX, Phenom, Athlon, Sempron, or Opteron processors manufactured by Advanced Micro Devices of Sunnyvale, California, USA; or the Snapdragon SoC processors manufactured by Qualcomm of San Diego, California, USA.

A processor also includes Application-Specific Integrated Circuit (ASIC). An ASIC is an Integrated Circuit (IC) customized to perform a specific series of logical operations is controlling a computer to perform specific tasks or functions. An ASIC is an example of a processor for a special purpose computer, rather than a processor configured for general-purpose use. An application-specific integrated circuit generally is not reprogrammable to perform other functions and may be programmed once when it is manufactured.

In another example, a processor may be of the "field programmable" type. Such processors may be programmed multiple times "in the field" to perform various specialized or general functions after they are manufactured. A field-programmable processor may include a Field-Programmable Gate Array (FPGA) in an integrated circuit in the processor. FPGA may be programmed to perform a specific series of instructions which may be retained in nonvolatile memory cells in the FPGA. The FPGA may be configured by a customer or a designer using a hardware description language (HDL). In FPGA may be reprogrammed using another computer to reconfigure the FPGA to implement a new set of commands or operating instructions. Such an operation may be executed in any suitable means such as by a firmware upgrade to the processor circuitry.

Just as the concept of a computer is not limited to a single physical device in a single location, so also the concept of a "processor" is not limited to a single physical logic circuit or package of circuits but includes one or more such circuits or circuit packages possibly contained within or across multiple computers in numerous physical locations. In a virtual computing environment, an unknown number of physical processors may be actively processing data, the unknown number may automatically change over time as well.

The concept of a "processor" includes a device configured or programmed to make threshold comparisons, rules comparisons, calculations, or perform logical operations applying a rule to data yielding a logical result (e.g. "true" or "false"). Processing activities may occur in multiple single processors on separate servers, on multiple processors in a single server with separate processors, or on multiple processors physically remote from one another in separate computing devices.

"Power Cable" generally refers to a cable configured to transfer electrical power as part of an electrical circuit. A power cable may be used exclusively to transfer power, or it may be used to also transfer signals, such as in the case of a Power Line Communication (PLC) system.

"Rear-facing" generally refers to facing away from the rear of a vehicle or structure.

"Refrigeration Sensor" generally refers to temperature sensors configured to report temperature data in a refrigerated environment.

"Remote Computing Device" generally refers to a computing device that is located in a separate locating from other devices it may be in communication via any suitable communication link such as a wireless or wired network.

"Reverse Lamp" generally refers to a rear-facing lamp on a vehicle that is configured to illuminate the area behind the vehicle, and to warn others nearby that the vehicle is in the reverse mode and may soon begin moving backward.

"Running Lamp" generally refers to a lamp on a vehicle that is activated to provide others nearby with additional visual cues as to the size of the vehicle and it's direction of travel. Such lamps commonly emit white, yellow, or amber light.

"Sensor" generally refers to a transducer configured to sense or detect a characteristic of the environment local to the sensor. For example, sensors may be constructed to detect events or changes in quantities or sensed parameters providing a corresponding output, generally as an electrical or electromagnetic signal. A sensor's sensitivity indicates how much the sensor's output changes when the input quantity being measured changes.

"Sense parameter" generally refers to a property of the environment detectable by a sensor. As used herein, sense parameter can be synonymous with an operating condition, environmental factor, sensor parameter, or environmental condition. Sense parameters may include temperature, air pressure, speed, acceleration, the presence or intensity of sound or light or other electromagnetic phenomenon, the strength and/or orientation of a magnetic or electrical field, and the like.

"Signal" generally refers to a function or means of representing information. It may be thought of as the output of a transformation or encoding process. The concept generally includes a change in the state of a medium or carrier that conveys the information. The medium can be any suitable medium such as air, water, electricity, magnetism, or electromagnetic energy such as in the case of radio waves, pulses of visible or invisible light, and the like.

As used herein, a "signal" implies a representation of meaningful information. Arbitrary or random changes in the state of a carrier medium are generally not considered "signals" and may be considered "noise". For example, arbitrary binary data streams are not considered as signals. On the other hand, analog and digital signals that are representations of analog physical quantities are examples of signals. A signal is commonly not useful without some way to transmit or send the information, and a receiver responsive to the transmitter for receiving the information.

In a communication system, for example, a transmitter encodes a message to a signal, which is carried to a receiver by the communications channel. For example, the words "The time is 12 o'clock" might be the message spoken into a telephone. The telephone transmitter may then convert the sounds into an electrical voltage signal. The signal is transmitted to the receiving telephone by wires, at the receiver it is reconverted into sounds.

Signals may be thought of as "discrete" or "continuous." Discrete-time signals are often referred to as time series in other fields. Continuous-time signals are often referred to as continuous signals even when the signal functions are not continuous, such as in a square-wave signal.

Another categorization is signals which are "discrete-valued" and "continuous-valued". Particularly in digital signal processing a digital signal is sometimes defined as a sequence of discrete values, that may or may not be derived from an underlying continuous-valued physical process. In other contexts, digital signals are defined as the continuous-time waveform signals in a digital system, representing a bit-stream. In the first case, a signal that is generated by means of a digital modulation method may be considered as converted to an analog signal, while it may be considered as a digital signal in the second case.

"Socket" generally refers a device into which something fits in order to electrically and/or physically connect another electrical device to a circuit.

"Stop-tail-turn Lamp" or "STT Lamp" generally refers to a lamp which is compliant with present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108.

"Switch" or "Switching Device" generally refers to an electrical component that can break an electrical circuit. A switch may interrupt the current in the circuit, and/or divert the flow of current from one conductor electrically coupled to one circuit, to another separate conductor electrically coupled to a separate circuit. The mechanism of a switch may be operated directly by a human operator (e.g. turning on a light switch, pressing a keyboard button, or by moving a hand to break a beam of light), may be operated by one object moving adjacent to or relative to another object such as a door-operated switch, or may be operated by a sensor detecting changes in a sensed parameter such as pressure, temperature, magnetic or electrical field strength, and the like.

A switch may divert current from on conductor to another by any suitable means such as by physically moving a switching element contacting one conductor electrically coupled to a first circuit, to directly contact a different conductor electrically coupled to a second circuit. This may occur by physical mechanical means (e.g. one or more metal contacts moving inside a switch, relay, or contactor), or by changing the electrical properties of a material such as a semiconducting material to temporarily break and/or divert a flow of current. For example, a transistor may operate as a switch diverting the flow of electricity when a voltage or current applied to one pair of the transistor's terminals changes the current through another pair of terminals.

"Rear Position Lamp" or "Tail Lamp" generally refers to rear-facing lamps of a vehicle that are generally configured to emit red light. Tail lamps are generally configured to be active when front position lamps are lit, or when the headlamps are on. Rear position lamps may be combined with a vehicle's stop lamps or separate from them. In combined-function installations, the lamps produce brighter red light for the stop lamp function and dimmer red light for the rear position lamp function. As used herein, the term generally refers to a tail lamp which is compliant with present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108.

"Temperature Sensor" generally refers to a device configured to sense temperature. Examples include thermocouples, resistor temperature detectors, thermistors, thermometers, semiconductors, and IR Sensors.

"Terminal" generally refers to a plug, socket or other connection (male, female, mixed, hermaphroditic, or otherwise) for mechanically and electrically connecting two or more wires or other conductors.

"Trailer" generally refers to a vehicle without an engine, often in the form of a flat frame or a container, which can be pulled by another vehicle.

"Transceiver" generally refers to a device that performs both transmitting and receiving functions. Examples include wireless communications devices such as cellular telephones, cordless telephone sets, handheld two-way radios, mobile two-way radios, as well as in the context of computer networking hardware such as in the case of devices configured to transmit and receive data packets. In another example, term is used in reference to transmitter/receiver devices in cable or optical fiber systems.

"Truck" generally refers to a powered truck (also known as a tractor or cab) for pulling a trailer.

"Turn Signal Lamp" generally refers to lamps positioned on a vehicle or trailer to warn of a change in the direction of travel when activated. Sometimes referred to as "direction indicators" or "directional signals", or as "directionals", "blinkers", "indicators" or "flashers"—turn signal lam blinking lamps mounted near the left and right front and rear corners of a vehicle or trailer. As used herein, the term generally refers to a turn signal lamp which is compliant with present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108

"Unitary Molded Structure" generally refers to a structure formed as a single or uniform entity.

"Vehicle" generally refers to a self-propelled or towed device for transportation, including without limitation, car, truck, bus, boat, tank or other military vehicle, airplane, truck trailer, truck cab, boat trailer, other trailer, emergency vehicle, and motorcycle.

REFERENCE NUMBERS

100 adapter assembly
105 trailer component socket
110 adapter
115 trailer component
120 adapter input terminals
125 trailer socket terminals
130 adapter output terminals
135 trailer component input terminals
140 adapter mode selection terminals
145 component mode selection terminals
150 component control logic
155 adapter circuit
160 trailer
200 adapter assembly
201 adapter
202 trailer component socket
205 power input terminal
210 ground terminal
215 control input
220 optional second control input
225 socket power output
230 socket ground
235 socket control output
240 optional second socket control output
245 trailer power circuit
250 trailer ground circuit
255 trailer control cable
260 optional second trailer control cable
300 adapter assembly

301 adapter
305 power output terminal
310 ground output terminal
315 component power terminal
320 component ground terminal
330 mode selector
335 adapter control output
340 optional second control output
345 component control input
350 optional additional control input
355 control terminals
400 adapter assembly
401 adapter
405 mode selector
410 dual position switches
500 adapter assembly
501 adapter
505 mode selector
510 housing
515 programming interface
520 communication link
525 remote computing device
530 memory
535 programming input terminal
600 adapter circuit
605 adapter mode selection terminal
610 adapter mode selection terminal
615 adapter mode selection terminal
620 adapter mode selection terminal
700 adapter circuit
702 power trace
705 ground trace
800 adapter circuit
802 power trace
805 ground trace
900 adapter circuit
902 power trace
1000 adapter circuit
1002 power trace
1005 ground trace
1100 adapter assembly
1101 adapter
1105 communication interface
1110 memory
1115 mode selector
1200 adapter assembly
1201 adapter
1205 nosebox terminals
1210 ground terminal
1215 master control circuit
1220 nose box
1225 control command
1230 trailer wiring
1235 slave control circuit
1240 address
1245 address
1250 truck terminals
1255 control input
1260 mode
1265 output terminals
1270 trailer component
1275 truck
1300 adapter assembly
1305 CAN master controller
1310 master control circuit
1315 CAN high communication cable
1320 CAN low communication cable
1325 CAN protocol
1335 slave control circuit
1345 adapter
1350 trailer component
1355 slave CAN controller
1400 adapter assembly
1405 LIN master controller
1410 master control circuit
1415 LIN communication cable
1425 LIN Protocol
1435 slave control circuit
1445 adapter
1455 LIN slave controller
1460 trailer component
1500 trailer components
1502 lamp(s)
1505 sensors
1507 braking system
1509 cameras
1512 refrigeration system
1513 running lamps
1515 interior illumination lamps
1516 clearance lamps
1517 backup
1519 license plate lamp(s)
1521 stop lamps
1523 tail lamps
1525 right turn lamps
1527 left turn lamps
1528 stop-tail-turn
1529 temperature sensor
1531 door sensor
1533 cargo sensor
1535 humidity sensor
1537 tank level sensor
1539 proximity sensor
1541 tire pressure sensor
1543 Anti-lock Brakes (ABS) controller
1547 pressure sensor
1548 ABS lamp
1549 temperature sensor
1551 controller
1553 refrigerant level
1555 backup camera
1557 side camera

What is claimed is:

1. An adapter for use with components of a trailer, comprising:

a Printed Circuit Board (PCB) that includes:

a power terminal passing through the PCB from a first side to a second side that is configured to contact a corresponding power terminal of a trailer component socket;

a ground terminal passing through the PCB from the first side to the second side that is configured to contact a corresponding ground terminal of the trailer component socket; and multiple mode selection terminals on the second side of the printed circuit board, wherein the multiple mode selection terminals are arranged on the PCB to align with and make contact with corresponding mode selection input terminals of a trailer component positioned in the trailer component socket;

traces arranged in fixed positions on the PCB, the traces electrically connecting at least some of the multiple mode selection terminals to the power terminal or the ground terminal by virtue of the position of the traces on the PCB;

wherein a mode selection is permanently fixed according to the position of the traces on the PCB board; and wherein the trailer component includes control logic configured to activate and deactivate the trailer component according to the electrical connections to the power and ground terminals and the multiple mode selection terminals.

2. The adapter of claim 1, comprising:

at least two communication terminals on the first side of the printed circuit board, wherein the communication terminals are aligned with and configured to make contact with corresponding communication terminals of the trailer component socket, and wherein the trailer component socket is configured to accept at least a portion of a trailer component.

3. The adapter of claim 1, wherein the multiple input terminals include:

at least one control input configured to electrically connect to at least one control cable of the trailer.

4. The adapter of claim 1, wherein at least two input terminals pass through the printed circuit board from the first side to the second side.

5. The adapter of claim 1, wherein the PCB is positionable within the trailer component socket between the power and ground terminals of the trailer component socket and the input terminals of the trailer component.

6. The adapter of claim 1, wherein the traces electrically connect one of the multiple mode selection terminals to the power terminal.

7. The adapter of claim 1, wherein the traces electrically connect one of the multiple mode selection terminals to the ground terminal.

8. The adapter of claim 1, wherein the multiple mode selection terminals include four terminals, wherein two of the multiple mode selection terminals are electrically connected to the power terminal, and wherein two of the multiple mode selection terminals are electrically connected to the ground terminal.

9. The adapter of claim 1, wherein the trailer component comprises:

a slave control circuit responsive to the mode selection input terminals of the trailer component, wherein the slave control circuit is responsive to control commands sent by a master control circuit.

10. The adapter of claim 9, wherein the slave control circuit is configured to activate an aspect of the trailer component when the master control circuit sends a control command with a mode that matches the input provided by the mode selection input terminals.

11. The adapter of claim 1, wherein the trailer component is a lamp, and wherein the mode selection terminals include a combination of power and ground electrical connections defining a brake mode.

12. The adapter of claim 1, wherein the trailer component is a rear-facing camera, and wherein the mode selection terminals include a combination of power and ground electrical connections defining a reverse mode.

13. The adapter of claim 1, wherein the power input terminal, the ground input terminal, and the at least one control output are electrically connected to a master control circuit mounted in a trailer nosebox of the trailer, wherein the master control circuit is configured to accept control input from a truck tractor, and wherein the master control circuit is configured to generate a component control command specific to the trailer component, and to deliver the component control command to the trailer component using communication cables electrically connected to the communication terminals of the trailer socket.

14. The adapter of claim 1, wherein the two communication terminals include a first and second control cable;

wherein the first and second control cables are electrically connected to a master Control Area Network (CAN) controller;

wherein the trailer component includes a slave CAN controller electrically connected to the first and second control cables; and wherein the master and slave CAN controllers communicate using a CAN protocol.

15. The adapter of claim 1, wherein the trailer component is any one of a vehicle stop-tail-turn lamp, a vehicle turn signal lamp, a vehicle brake lamp, a vehicle tail lamp, a vehicle running lamp, a vehicle anti-lock brake, a vehicle interior illumination lamp, or a vehicle reverse lamp.

16. The adapter of claim 1, wherein the trailer component is an antilock brake system controller, a pressure sensor, a temperature sensor, a door sensor, a cargo sensor, a cargo length sensor, a liquid level sensor, or a refrigeration sensor.

* * * * *